(12) United States Patent
Takamine

(10) Patent No.: US 7,876,176 B2
(45) Date of Patent: *Jan. 25, 2011

(54) ACOUSTIC WAVE FILTER DEVICE AND DUPLEXER

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/336,563

(22) Filed: Dec. 17, 2008

(65) Prior Publication Data

US 2009/0091404 A1 Apr. 9, 2009

Related U.S. Application Data

(63) Continuation of application No. PCT/JP2007/060707, filed on May 25, 2007.

(30) Foreign Application Priority Data

Jun. 21, 2006 (JP) ............... 2006-171669

(51) Int. Cl.
H03H 9/72 (2006.01)
H03H 9/64 (2006.01)

(52) U.S. Cl. ...................... 333/133; 333/195

(58) Field of Classification Search ............... 333/193, 333/195, 133
See application file for complete search history.

(56) References Cited

U.S. PATENT DOCUMENTS

| | | | |
|---|---|---|---|
| 6,693,501 B2 | 2/2004 | Sawada et al. | |
| 6,710,676 B2* | 3/2004 | Yata et al. | 333/133 |
| 6,720,842 B2 | 4/2004 | Sawada | |
| 6,731,188 B2* | 5/2004 | Sawada et al. | 333/193 |
| 6,744,333 B2 | 6/2004 | Sawada | |
| 6,815,868 B2 | 11/2004 | Shibata et al. | |
| 7,015,776 B2 | 3/2006 | Takamine | |
| 7,030,716 B2* | 4/2006 | Tsutsumi et al. | 333/133 |

(Continued)

FOREIGN PATENT DOCUMENTS

| | | | |
|---|---|---|---|
| DE | 198 18 038 A1 * | 11/1999 | |
| JP | 2006-128927 A | 5/2006 | |
| WO | 2005/031971 A1 | 4/2005 | |
| WO | WO 2006/087875 A1 * | 8/2006 | |

OTHER PUBLICATIONS

Official Communications issued in International Patent Application No. PCT/JP2007/060707, mailed on Sep. 18, 2007.

*Primary Examiner*—Barbara Summons
(74) *Attorney, Agent, or Firm*—Keating & Bennett, LLP

(57) ABSTRACT

An acoustic wave filter device includes first to fourth longitudinally coupled resonator type surface acoustic wave filters that are configured such that the first and second filters are connected to a first balanced signal terminal, the third and fourth filters are connected to a second balanced signal terminal, and a transmission phase of a signal output from the first balanced signal terminal relative to an input signal differs by about 180 degrees with respect to a transmission phase of a signal output from the second balanced signal terminal relative to an input signal. In addition, the number of pairs of electrode fingers of at least one of IDTs of at least one of the first to fourth longitudinally coupled resonator type surface acoustic wave filters is different from the number of pairs of electrode fingers of corresponding IDTs of the remaining first to fourth filters.

7 Claims, 12 Drawing Sheets

U.S. PATENT DOCUMENTS

| | | | |
|---|---|---|---|
| 7,078,989 B2 * | 7/2006 | Inoue et al. | 333/195 |
| 7,190,242 B2 | 3/2007 | Takamine | |
| 7,330,089 B2 * | 2/2008 | Yata | 333/195 |
| 7,459,997 B2 * | 12/2008 | Takamine | 333/195 |
| 2002/0000898 A1 | 1/2002 | Takamine | |
| 2004/0080385 A1 | 4/2004 | Takamine et al. | |
| 2004/0106383 A1 | 6/2004 | Yata | |
| 2004/0155730 A1 | 8/2004 | Iwamoto et al. | |

* cited by examiner

ACOUSTIC WAVE FILTER DEVICE AND DUPLEXER

BACKGROUND OF THE INVENTION

1. Field of the Invention

The present invention relates to acoustic wave filter devices which utilize surface acoustic waves and boundary acoustic waves, and more particularly, to an acoustic wave filter device and a duplexer including the acoustic wave filter, each of which includes a plurality of longitudinally coupled resonator type surface acoustic wave filters connected to one another.

2. Description of the Related Art

In general, cellular phones require a reduction in the number of components included therein in order to reduce the size thereof. Therefore, it is desirable that a single component has a plurality of functions. An example of such a component having a plurality of functions is a balanced duplexer. The balanced duplexer includes a transmission filter connected to an antenna terminal and a reception filter having a balanced-to-unbalanced conversion function. Since the reception filter includes the balanced-to-unbalanced conversion function, a component providing the balanced-to-unbalanced conversion function, that is, a balun, can be eliminated.

An example of a surface acoustic wave filter device used as a reception filter device is disclosed in Japanese Unexamined Patent Application Publication No. 2002-290203.

FIG. 19 is a plan view schematically illustrating a configuration of the electrodes of the surface acoustic filter device disclosed in Japanese Unexamined Patent Application Publication No. 2002-290203.

A surface acoustic wave filter device 1001 is a balanced longitudinally coupled resonator type surface acoustic wave filter device. The surface acoustic wave filter device 1001 includes an electrode configuration provided on a piezoelectric substrate as shown in FIG. 19.

The surface acoustic wave filter device 1001 includes an unbalanced signal terminal 1002 defining an input terminal and first and second balanced signal output terminals 1003 and 1004 defining output terminals. First and second longitudinally coupled resonator type surface acoustic wave filters 1005 and 1006 are connected to the unbalanced signal terminal 1002. The first longitudinally coupled resonator type surface acoustic wave filter 1005 includes three interdigital transducers (IDTs) 1005a to 1005c and the second longitudinally coupled resonator type surface acoustic wave filter 1006 includes three IDTs 1006a to 1006c. Note that a region including the IDTs 1005a to 1005c is sandwiched between reflectors 1005d and 1005e in a surface wave propagation direction. In the second longitudinally coupled resonator type surface acoustic wave filter 1006, reflectors 1006d and 1006e are similarly arranged.

One end of the center IDT 1005b and one end of the center IDT 1006b are connected to the unbalanced signal terminal 1002, and the other end of the IDT 1005b and the other end of the IDT 1006b are connected to a ground potential. One end of the IDT 1005a and one end of the IDT 1005c arranged on both sides the center IDT of the first longitudinally coupled resonator type surface acoustic wave filter 1005, respectively, are connected to the first balanced signal terminal 1003. The other end of the IDT 1005a and the other end of the IDT 1005c are connected to the ground potential. Similarly, one end of the IDT 1006a and one end of the IDT 1006c arranged on both sides the center IDT of the first longitudinally coupled resonator type surface acoustic wave filter 1006, respectively, are connected to the second balanced signal terminal 1004. The other end of the IDT 1006a and the other end of the IDT 1006c are connected to the ground potential.

Here, a balanced-to-unbalanced conversion function is obtained such that a phase of a signal output from the first longitudinally coupled resonator type surface acoustic wave filter 1005 in response to a signal input to the first longitudinally coupled resonator type surface acoustic wave filter 1005 differs by about 180 degrees with respect to a phase of a signal output from the second longitudinally coupled resonator type surface acoustic wave filter 1006 in response to a signal input to the second longitudinally coupled resonator type surface acoustic wave filter 1006. Design parameters of the first longitudinally coupled resonator type surface acoustic wave filter 1005 are substantially the same as those of the second longitudinally coupled resonator type surface acoustic wave filter 1006, except for the phase of the output signal relative to the input signal.

Since the longitudinally coupled resonator type surface acoustic wave filter device 1001 disclosed in Japanese Unexamined Patent Application Publication No. 2002-290203 includes the balanced-to-unbalanced conversion function, the surface acoustic wave filter device 1001 can be used as the reception filter of the balanced duplexer described above. Accordingly, a reduction in the number of components of a cellular phone can be achieved.

However, in a reception filter of a duplexer, an attenuation in a passband of a transmission filter should be sufficiently large. When the surface acoustic wave filter device disclosed in Japanese Unexamined Patent Application Publication No. 2002-290203 is used as the reception filter, the amount of attenuation in the passband of the transmission filter, that is, an attenuation outside of a passband of the surface acoustic wave filter device 1001 defining the reception filter should be sufficiently large.

In typical cellular phones, a transmission frequency band is lower than a reception frequency band. Accordingly, when the surface acoustic wave filter device 1001 is used as the reception filter, an attenuation in frequencies which are outside of the passband and which is lower than the passband should be sufficiently large.

In a typical longitudinally coupled resonator type surface acoustic wave filter device, an attenuation in frequencies lower than a passband significantly depends on the frequency characteristics of the IDTs, and is primarily determined by synthesizing the frequency characteristics of all of the IDTs. That is, when an attenuation in a specific frequency band is large, attenuation poles of frequency characteristics of a plurality of IDTs substantially correspond to each other, whereas when an attenuation in a wide frequency band is made to be large, attenuation poles of frequency characteristics of a plurality of IDTs are slightly shifted from one another. However, the number of pairs of electrode fingers of the IDTs significantly affects a passband width and impedance characteristics, and accordingly, a degree of freedom of control is restricted.

On the other hand, when an attenuation outside of the passband is made to be large, the number of pairs of electrode fingers of the IDTs in the first longitudinally coupled resonator type surface acoustic wave filter 1005 may be different from the number of pairs of electrode fingers of the IDTs in the second longitudinally coupled resonator type surface acoustic wave filter 1006. However, when the amount of out-of band attenuation is increased by setting the number of pairs of electrode fingers of the IDTs in the first longitudinally coupled resonator type surface acoustic wave filter 1005 to be different from the number of pairs of electrode fingers of the IDTs in the second longitudinally coupled resonator type surface acoustic wave filter 1006, a problem arises in that a degree of balance between signals output from the first and second balanced signal output terminals 1003 and 1004 is significantly degraded.

Recently, instead of a surface acoustic wave filter device, a boundary acoustic wave filter utilizing boundary acoustic waves has been disclosed. The boundary acoustic wave filter has a simple package configuration. Similar to the surface acoustic wave filter, there are demands for a boundary acoustic wave filter having a balanced-to-unbalanced conversion function and a configuration capable of increasing an out-of-band attenuation.

SUMMARY OF THE INVENTION

To overcome the problems described above, preferred embodiments of the present invention provide an acoustic wave filter device that is capable of increasing an out-of-band attenuation without deteriorating the balance between signals output from first and second balanced signal terminals and a duplexer including the acoustic wave filter device as a reception filter.

According to a first preferred embodiment of the present invention, an acoustic wave filter device includes a piezoelectric substrate, first to fourth longitudinally coupled resonator type surface acoustic wave filters, each of which includes first to third IDTs arranged on the piezoelectric substrate in an acoustic wave propagation direction, an unbalanced signal terminal which is connected to input terminals of the first to fourth longitudinally coupled resonator type surface acoustic wave filters, a first balanced signal terminal which is connected to output terminals of the first and second longitudinally coupled resonator type surface acoustic wave filters, and a second balanced signal terminal which is connected to output terminals of the third and fourth longitudinally coupled resonator type surface acoustic wave filters. A phase of an output signal of the first longitudinally coupled resonator type surface acoustic wave filter relative to an input signal is substantially the same as a phase of an output signal of the second longitudinally coupled resonator type surface acoustic wave filter relative to an input signal. A phase of an output signal of the third longitudinally coupled resonator type surface acoustic wave filter relative to an input signal is substantially the same as a phase of an output signal of the fourth longitudinally coupled resonator type surface acoustic wave filter relative to an input signal. The phase of the output signal of the first longitudinally coupled resonator type surface acoustic wave filter relative to the input signal differs by about 180 degrees with respect to the phase of the output signal of the third longitudinally coupled resonator type surface acoustic wave filter relative to the input signal. The number of pairs of electrode fingers of at least one of the IDTs of at least one of the first to fourth longitudinally coupled resonator type surface acoustic wave filters is different from the numbers of pairs of electrode fingers of the corresponding IDTs of the other longitudinally coupled resonator type surface acoustic wave filters.

In the acoustic wave filter device of the first preferred embodiment of the present invention, when a sum of the number of pairs of electrode fingers of the first to third IDTs of each of the first to fourth longitudinally coupled resonator type acoustic wave filters is defined as the total number of pairs, the total number of pairs of the first longitudinally coupled resonator type acoustic wave filter is equal to the total number of pairs of the third longitudinally coupled resonator type acoustic wave filter, the total number of pairs of the second longitudinally coupled resonator type acoustic wave filter is equal to the total number of pairs of the fourth longitudinally coupled resonator type acoustic wave filter, and the total number of pairs of the first longitudinally coupled resonator type acoustic wave filter is different from the total number of pairs of the second longitudinally coupled resonator type acoustic wave filter. In this case, a balance between a signal output from the first balanced signal terminal and a signal output from the second balanced signal terminal can be further improved.

According to a second preferred embodiment of the present invention, an acoustic wave filter device is provided which includes a piezoelectric substrate, first to third longitudinally coupled resonator type acoustic wave filters, each of which includes first to third IDTs arranged on the piezoelectric substrate in an acoustic wave propagation direction, and an unbalanced signal terminal which is connected to input terminals of the first to third longitudinally coupled resonator type acoustic wave filters and first and second balanced signal terminals. A phase of an output signal of the first longitudinally coupled resonator type acoustic wave filter relative to an input signal differs by about 180 degrees with respect to a phase of an output signal of the third longitudinally coupled resonator type acoustic wave filter relative to an input signal. The second longitudinally coupled resonator type acoustic wave filter includes first and second output terminals, and a phase of a signal output from the first output terminal relative to an input signal differs by about 180 degrees with respect to a phase of a signal output from the second output terminal relative to an input signal. The phase of the signal output from an output terminal of the first longitudinally coupled resonator type acoustic wave filter relative to the input signal is substantially the same as the phase of the signal output from the first output terminal of the second longitudinally coupled resonator type acoustic wave filter relative to the input signal. A phase of a signal output from an output terminal of the third longitudinally coupled resonator type acoustic wave filter relative to the input signal is substantially the same as the phase of the signal output from the second output terminal of the second longitudinally coupled resonator type acoustic wave filter relative to the input signal. The output terminal of the first longitudinally coupled resonator type acoustic wave filter and the first output terminal of the second longitudinally coupled resonator type acoustic wave filter are connected to the first balanced signal terminal. The output terminal of the third longitudinally coupled resonator type acoustic wave filter and the second output terminal of the second longitudinally coupled resonator type acoustic wave filter are connected to the second balanced signal terminal. The number of pairs of electrode fingers of at least one of the IDTs of at least one of the first to third longitudinally coupled resonator type acoustic wave filters is different from the number of pairs of electrode fingers of the corresponding IDTs of other longitudinally coupled resonator type acoustic wave filters.

A duplexer according to another preferred embodiment of the present invention includes a transmission filter and a reception filter. The reception filter is defined by the acoustic wave filter device according to preferred embodiments of the present invention. Since the acoustic wave filter device according to preferred embodiments of the present invention can obtain an increased amount of out-of-band attenuation without deteriorating balance, an attenuation in a passband of the transmission filter at the other end can be increased in the reception filter, and deterioration of balance of reception outputs obtained from the first and second balanced signal terminals of the reception filter can be suppressed. Accordingly, a duplexer which has the reduced number of components, which is miniaturized, and which has outstanding electric characteristics can be obtained.

In the acoustic wave filter device according to the first preferred embodiment of the present invention, the first to fourth longitudinally coupled resonator type acoustic wave filters, each of which includes the first to third IDTs, are connected to one another as described above and, and in addition, the number of pairs of at least one of the IDTs of at least one of the first to fourth longitudinally coupled resonator type surface acoustic wave filters is different from the number of pairs of electrode fingers of corresponding IDTs of other filters. Accordingly, a deterioration of balance is prevented and an increased amount of out-of-band attenuation is obtained.

Similarly, in the acoustic wave filter device according to the second preferred embodiment of the present invention, the first to third longitudinally coupled resonator type acoustic wave filters are connected to one another as described above so that the balanced-to-unbalanced conversion function is realized, and in addition, the number of pairs of electrode fingers of at least one of the IDTs of at least one of the first to third longitudinally coupled resonator type acoustic wave filters is different from the number of pairs of electrode fingers of corresponding IDTs of the other longitudinally coupled resonator type acoustic wave filters. Accordingly, a deterioration of balance is prevented and an increased amount of out-of-band attenuation is obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the accompanying drawings.

Figure 1:
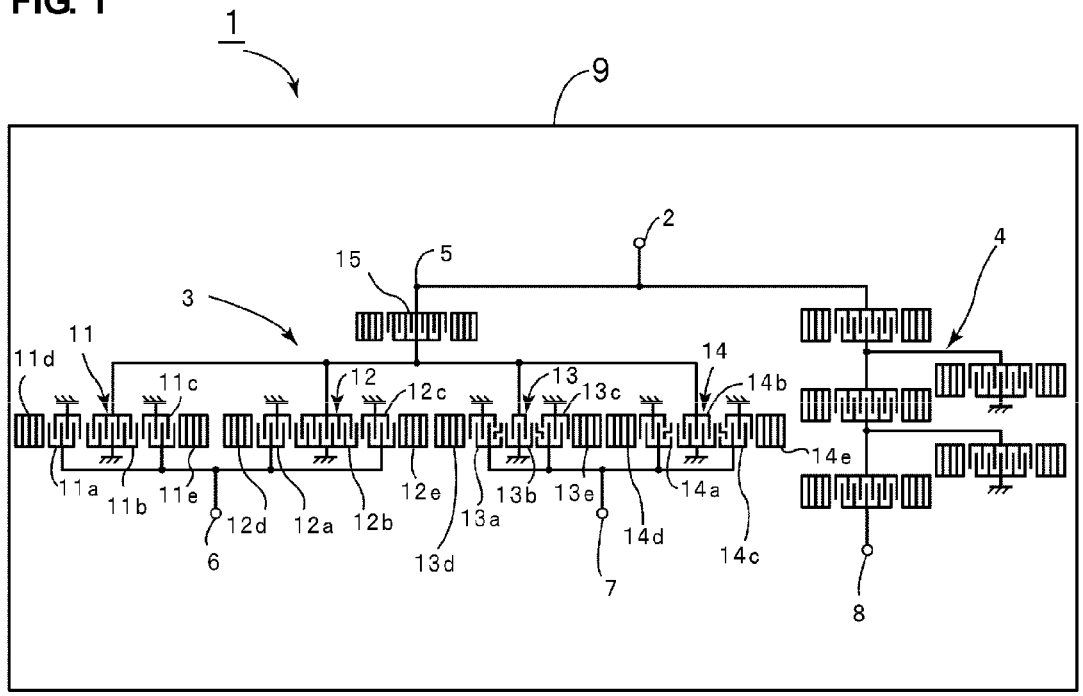
FIG. 1 is a plan view schematically illustrating a duplexer according to a first preferred embodiment of the present invention.

FIG. 1 is a plan view schematically illustrating a configuration of electrodes of a duplexer according to a first preferred embodiment of the present invention. A duplexer 1 includes an antenna terminal 2. A surface acoustic wave filter device 3 according to a preferred embodiment of the present invention defining a reception filter and a surface acoustic wave filter device 4 having a ladder type circuit configuration and defining a transmission filter are connected to the antenna terminal 2.

The surface acoustic wave filter device 3 includes an unbalanced signal terminal 5 connected to the antenna terminal 2 and first and second balanced signal terminals 6 and 7 defining reception output terminals. In addition, the surface acoustic wave filter device 4 includes one end that is connected to the antenna terminal 2 and the other end that is connected to a transmission terminal 8.

The reception filter of the duplexer 1 of this preferred embodiment is defined by the balanced longitudinally coupled resonator type surface acoustic wave filter device 3, and accordingly, is a balanced duplexer. The duplexer 1 of this preferred embodiment is provided in cellular phones utilizing a WCDMA system, for example. A transmission frequency band of the WCDMA is in a range from about 1920 MHz to about 1980 MHz, and a reception frequency band is in a range from about 2110 MHz to about 2170 MHz. Thus, a passband of the surface acoustic wave filter device 3 defining the reception filter corresponds to the range from about 2110 MHz to about 2170 MHz, and accordingly, an attenuation of a passband of a transmission side in the range from about 1920 MHz to about 1980 MHz should be relatively large.

The duplexer 1 includes an electrode configuration provided on a piezoelectric substrate 9 as shown in FIG. 1. The piezoelectric substrate 9 is preferably defined by a 40±5° Y-cut X-propagation LiTaO₃ substrate, for example. Since the LitaO₃ substrate having this crystal angle is preferably used, a reduction of an insertion loss of the longitudinally coupled resonator type surface acoustic wave filter device 3 defining the reception filter is obtained. Note that it is not necessary to arrange the transmission filter and the reception filter on the same piezoelectric substrate, and they may preferably be arranged on different piezoelectric substrates. Therefore, a piezoelectric substrate used in the surface acoustic wave filter device 4 defining the transmission filter may be made of a piezoelectric substrate material that is suitable for the transmission filter and that is different from the piezoelectric substrate described above.

Furthermore, the piezoelectric substrate 9 included in the longitudinally coupled resonator type surface acoustic wave filter device 3 is not limited to the 40±5° Y-cut X-propagation LiTaO₃, and other LiTaO₃ substrates, other piezoelectric single crystals, or piezoelectric ceramics may preferably be used, for example.

The longitudinally coupled resonator type surface acoustic wave filter device 3 defining the reception filter includes first to fourth 3-IDT longitudinally coupled resonator type surface acoustic wave filters 11 to 14. Input terminals of the first to fourth 3-IDT longitudinally coupled resonator type surface acoustic wave filters 11 to 14 are connected to one another and are further connected through a one-port type surface acoustic wave resonator 15 to the unbalanced signal terminal 5.

The one-port type surface acoustic wave resonator 15 is arranged on input sides of the first to fourth longitudinally coupled resonator type surface acoustic wave filters 11 to 14 and is connected to the first to fourth longitudinally coupled resonator type surface acoustic wave filters 11 to 14 so that a phase of the surface acoustic wave filter device 4 defining the transmission filter is substantially the same as a phase of the surface acoustic wave filter device 3. To connect a terminal of the transmission filter and a terminal of the reception filter to each other at a common connection point, it is ideal to have infinite impedance in a passband of one filter relative to the other filter. By connecting the one-port type surface acoustic wave resonator 15 to the longitudinally coupled resonator type surface acoustic wave filters 11 to 14 in series, a transmission frequency band is shifted to a high impedance side in the reception filter, and by selecting a capacitance of the one-port type surface acoustic wave resonator 15, the phase matching described above is obtained without using a phase matching element. Accordingly, miniaturization is achieved, and a reduced component mounting area is required in a cellular phone.

The first to fourth longitudinally coupled resonator type surface acoustic wave filters 11 to 14 include first to third IDTs 11a to 11c, first to third IDTs 12a to 12c, first to third IDTs 13a to 13c, and first to third IDTs 14a to 14c, respectively, arranged in a surface wave propagation direction. In the first longitudinally coupled resonator type surface acoustic wave filter 11, a region including the first to third IDTs 11a to 11c is sandwiched between reflectors 11d and 11e in the surface wave propagation direction. Similarly, the other longitudinally coupled resonator type surface acoustic wave filters 12 to 14 include reflectors 12d and 12e, reflectors 13d and 13e, and reflectors 14d and 14e, respectively.

In this preferred embodiment, first ends of the second IDTs 11b, 12b, 13b, and 14b which are arranged in the middle of the first to fourth longitudinally coupled resonator type surface acoustic wave filters 11 to 14, respectively, are connected through the one-port type surface acoustic wave resonator 15 to the unbalanced signal terminal 5, and second ends thereof are connected to a ground potential.

In the first and second longitudinally coupled resonator type surface acoustic wave filters 11 and 12, first ends of the first and third IDTs 11a and 11c which sandwich the IDT 11b and first ends of the first and third IDTs 12a and 12c which sandwich the IDT 12b are connected to one another and further connected to the first balanced signal terminal 6, and second ends thereof are connected to the ground potential.

Similarly, in the third and fourth longitudinally coupled resonator type surface acoustic wave filters 13 and 14, first ends of the first and third IDTs 13a and 13c and first ends of the first and third IDTs 14a and 14c are connected to one another and further connected to the second balanced signal terminal 7, and second ends thereof are connected to the ground potential.

A phase of a signal output from the first longitudinally coupled resonator type surface acoustic wave filter 11 relative to an input signal is substantially the same as a phase of a signal output from the second longitudinally coupled resonator type surface acoustic wave filter 12 relative to an input signal. A phase of a signal output from the third longitudinally coupled resonator type surface acoustic wave filter 13 relative to an input signal is substantially the same as a phase of a signal output from the fourth longitudinally coupled resonator type surface acoustic wave filter 14 relative to an input signal.

In addition, the phase of a signal output from the first longitudinally coupled resonator type surface acoustic wave filter 11 relative to an input signal differs by about 180 degrees with respect to the phase of a signal output from the third longitudinally coupled resonator type surface acoustic wave filter 13 relative to an input signal.

Accordingly, the surface acoustic wave filter device 3 has a balanced-to-unbalanced conversion function, and therefore, balanced outputs can be obtained from the first and second balanced signal terminals 6 and 7 as reception outputs.

Specifically, the IDTs 13a, 13c, 14a, and 14c are inverted with respect to the IDTs 11a, 11c, 12a, and 12c, and as described above, the phase of an output signal relative to an input signal in each of the first and second longitudinally coupled resonator type surface acoustic wave filters 11 and 12 differs by about 180 degrees with respect to the phase of an output signal relative to an input signal in each of the third and fourth longitudinally coupled resonator type surface acoustic wave filters 13 and 14.

According to this preferred embodiment, first ends of the IDTs 13a and 13c which are arranged closer to the IDT 13b sandwiched between the IDTs 13a and 13c and first ends of the IDTs 14a and 14c which are arranged closer the IDT 14b sandwiched between the IDTs 14a and 14c are preferably subjected to series weighting so that balance between signals of the first and second balanced signal terminals 6 and 7 is improved. The series weighting is preferably performed using a configuration in which a floating electrode finger is provided between electrode fingers located in an end portion of an IDT and an electrode finger located on an inner side of the IDT so as to extend across the electrode fingers. By performing the series weighting, a potential difference between the electrode fingers at the end portion of the IDT which have been subjected to the series weighting can be reduced. Therefore, with this configuration, the balance between a reception output signal output from the first balanced signal terminal 6 and a second reception output signal output from the second balanced signal terminal 7 can be improved.

In addition, in this preferred embodiment, in the surface acoustic wave filter device 3 having the first to fourth longitudinally coupled resonator type surface acoustic wave filters 11 to 14, the number of pairs of electrode fingers of at least one of the IDTs is different from the number of pairs of electrode fingers of corresponding at least one of the IDTs of another longitudinally coupled resonator type surface acoustic wave filter, to thereby further suppress a deterioration of the balance and increase an out-of-band attenuation. This characteristic will be described in detail based on an experimental example.

It is assumed that the surface acoustic wave filter device 3 having an impedance on the antenna terminal 2 side of about 50Ω and an impedance on the first and second balanced signal terminals 6 and 7 side of about 100Ω is designed as follows.

A wavelength determined by a pitch between the electrode fingers of the IDTs is λI.

Crossing width of the electrode fingers of the IDTs: about 19.2 λI

The number of electrode fingers in each of the IDTs 11a and 11c: 29

The number of electrode fingers in the IDT 11b: 53

The number of electrode fingers in the reflectors 11d and 11e: 65

Metallization ratio: about 0.67

Electrode film thickness: about 0.106 λI

The second longitudinally coupled resonator type surface acoustic wave filter 12 preferably has a configuration substantially the same as that of the first longitudinally coupled resonator type surface acoustic wave filter 11 except that the number of electrode fingers of the middle IDT 12b is 55.

The third longitudinally coupled resonator type surface acoustic wave filter 13 preferably has a configuration substantially the same as that of the first longitudinally coupled resonator type surface acoustic wave filter 11 except that the number of electrode fingers of the middle IDT 13b is 49 and the first and third IDTs 13a and 13c are subjected to the series weighting.

The fourth longitudinally coupled resonator type surface acoustic wave filter 14 preferably has a configuration that is substantially the same as that of the first longitudinally coupled resonator type surface acoustic wave filter 11 except that the number of electrode fingers of the middle IDT 14b is 51 and the first and third IDTs 14a and 14c are subjected to the series weighting.

The one-port type surface acoustic wave resonator 15 is configured as follows assuming that a wave length determined by a pitch between the electrode fingers of the IDTs is λI.

Crossing width of the electrode fingers: about 14.6 λI

The number of electrode fingers in an IDT: 241

The number of electrode fingers in a reflector: 15

Metallization ratio: about 0.58

Electrode film thickness: about 0.109 λI

Note that although only a single surface acoustic wave resonator 15 is shown in the drawing, three surface acoustic wave resonators are connected in series in this experimental example.

In the longitudinally coupled resonator type surface acoustic wave filter device 3 according to the first preferred embodiment, as described above, the number of pairs of electrode fingers of the individual IDTs 11b, 12b, 13b, and 14b, each of which are arranged in the middle, are preferably different from one another, and the other design parameters are substantially the same. That is, among the first and fourth longitudinally coupled resonator type surface acoustic wave filter devices 11 to 14, the number of pairs of electrode fingers of the IDT arranged in the middle of at least one of the longitudinally coupled resonator type surface acoustic wave filters is different from the number of pairs of electrode fingers of the second IDTs individually arranged in the middle of the other longitudinally coupled resonator type surface acoustic wave filters.

Figure 2:
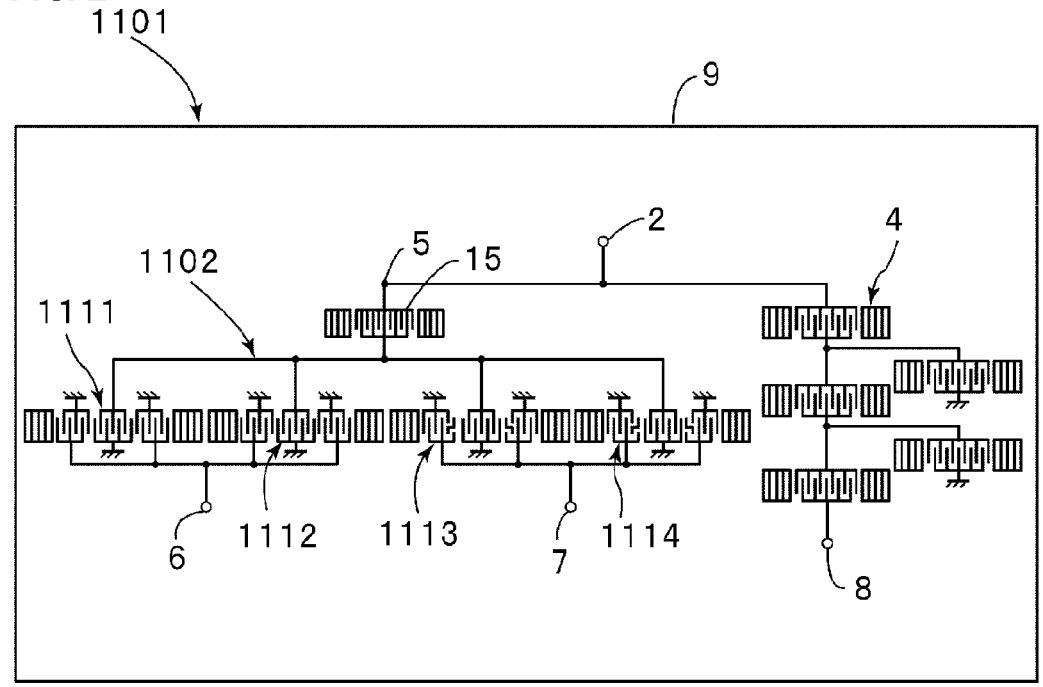
FIG. 2 is a plan view schematically illustrating a duplexer according to a first comparative example.

For comparison, a duplexer 1101 of a first comparative example is shown in FIG. 2. The duplexer 1101 includes a ladder type surface acoustic wave filter device 4 on a transmission side which is configured in a similar manner as in the preferred embodiment described above. However, a reception filter 1102 is different from the longitudinally coupled resonator type surface acoustic wave filter device of the first preferred embodiment. That is, first to fourth longitudinally coupled resonator type surface acoustic wave filters 1111 to 1114 are provided in the first comparative example, and the number of pairs of electrode fingers included in individual IDTs arranged in the middle of the corresponding first to fourth longitudinally coupled resonator type surface acoustic wave filters 1111 to 1114 are all the same, that is, 53. Other configurations of the reception filter 1102 are similar to those of the reception filter of the first preferred embodiment.

Figure 3:
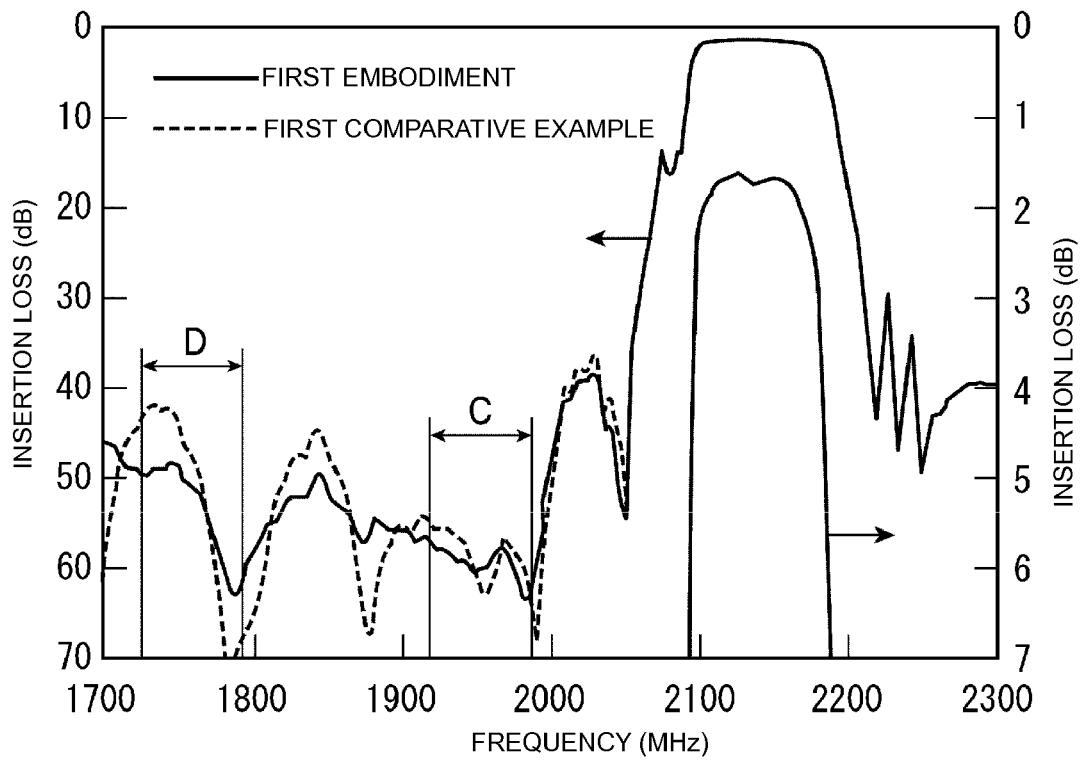
FIG. 3 is a diagram illustrating a transmission characteristic from an antenna terminal to a reception output terminal of the duplexer according to the first preferred embodiment of the present invention and a transmission characteristic from an antenna terminal to a reception output terminal of the duplexer according to the first comparative example.
Figure 4:
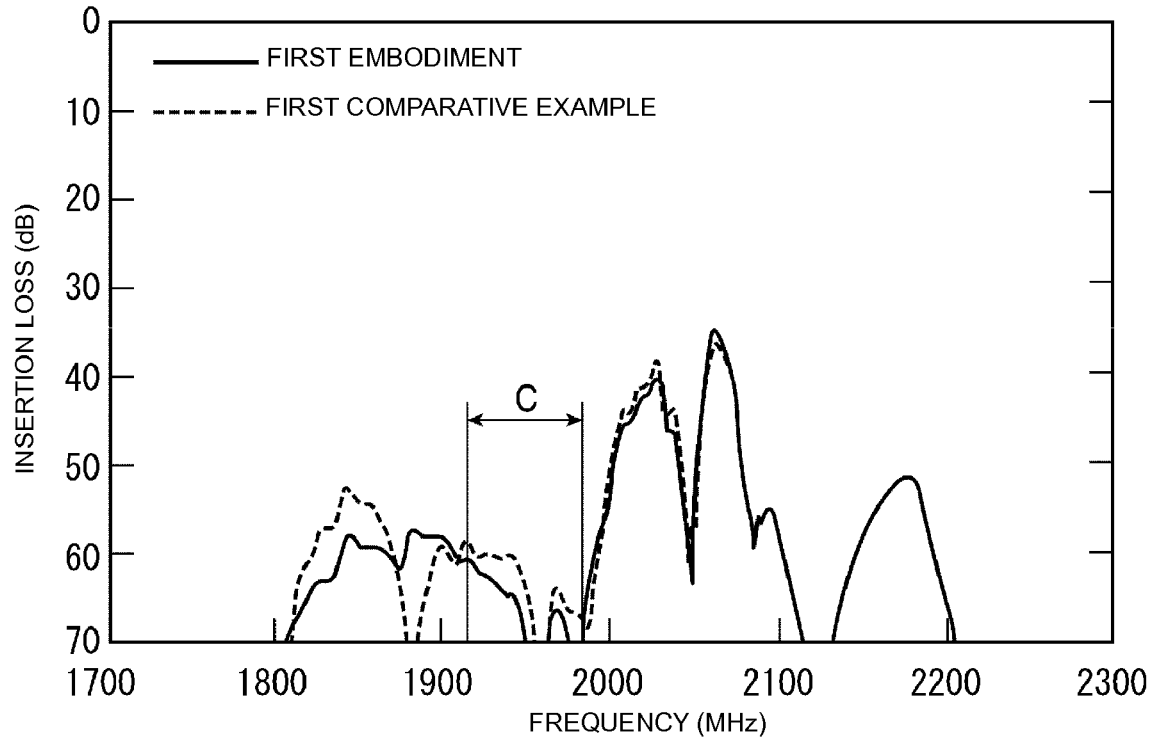
FIG. 4 is a diagram illustrating an isolation characteristic which is a transmission characteristic from a transmission input terminal to the reception output terminal of the duplexer according to the first preferred embodiment of the present invention and an isolation characteristic which is a transmission characteristic from a transmission input terminal to the reception output terminal of the duplexer according to the first comparative example.

FIG. 3 shows transmission characteristics from the antenna terminals to the first and second reception output terminals of the duplexer of the first preferred embodiment and the duplexer of the first comparative example. In FIG. 3, a solid line denotes the result of the first preferred embodiment, and a dashed line denotes the result of the first comparative example. FIG. 4 shows isolation characteristics which are transmission characteristics from the transmission input terminals to the reception output terminals. FIG. 5 shows amplitude differences and phase differences between the first and second balanced signal terminals. Similarly, in FIGS. 4 and 5, solid lines denote the results of the first preferred embodiment and dashed lines denote the results of the first comparative example.

Note that the amplitude differences and the phase differences are values defined as follows.

It is assumed that a filter device having a balanced-to-unbalanced conversion function is a three-port type device. For example, when a first port corresponds to an unbalanced input terminal, and second and third ports correspond to first and second balanced signal terminals, the following equations are obtained:

Amplitude Difference=|A|, A=|20 log(S21)|−|20 log(S31)|

Phase Difference=|B−180|, where B=|∠S21−∠S31|

Note that S21 denotes a coefficient of a propagation from the first port to the second port, and S31 denotes a coefficient of a propagation from the first port to the third port.

As shown in FIG. 3, an attenuation in a transmission frequency band C located on a lower side relative to a passband of the reception filter of the first comparative example is about 54.5 dB whereas an attenuation in the transmission frequency band C located on a lower side relative to the passband of the reception filter of the first preferred embodiment is about 56.5 dB, which is improved by about 2 dB.

To reduce noise of a reception circuit in a duplexer, an attenuation in a frequency band (hereinafter referred to as a "2Tx-Rx band") corresponding to a value obtained by subtracting a reception frequency from twice a transmission frequency in a reception filter should be relatively large. In a duplexer using a WCDMA system, the 2Tx-Rx band corresponds to a range from about 1730 MHz to about 1790 MHz. As shown in FIG. 3, an attenuation in the 2Tx-Rx band D in the first comparative example is about 43.5 dB, whereas the same in the first preferred embodiment is about 48.5 dB, which is improved by about 5 dB.

Referring to FIG. 4, an isolation characteristic of the transmission frequency band in the first comparative example is about 58.5 dB, whereas the same of the first preferred embodiment is about 60.5 dB, which is improved by about 2 dB. Furthermore, as shown in FIG. 3, a difference between an insertion loss in the passband of the first preferred embodiment and an insertion loss in the passband of the first comparative example and a difference between a passband width of the first preferred embodiment and a passband width of the first comparative example are negligible.

These results are obtained due to the following reason. An attenuation in a frequency band lower than a passband is determined in accordance with a value obtained by synthesizing the frequency characteristics of IDTs, and since frequency characteristics of the second IDTs 11b to 14b located in the middle of the first to fourth longitudinally coupled resonator type surface acoustic wave filters 11 to 14 are different from one another due to the different number of pairs of electrode fingers of the IDTs 11b to 14b of the first to fourth longitudinally coupled resonator type surface acoustic wave filters 11 to 14, a characteristic obtained through the synthesis causes the amount of attenuation to be large. In the first preferred embodiment, since the surface acoustic wave filter device 3 having the balanced-to-unbalanced conversion function is defined by the first to fourth longitudinally coupled resonator type surface acoustic wave filters, the synthesized characteristic in the passband is influenced less by a difference between characteristics in passbands of the first to fourth longitudinally coupled resonator type surface acoustic wave filters 11 to 14 than the configuration disclosed in Japanese Unexamined Patent Application Publication No. 2002-290203 in which two longitudinally coupled resonator type surface acoustic wave filter devices are provided.

Figure 5A:
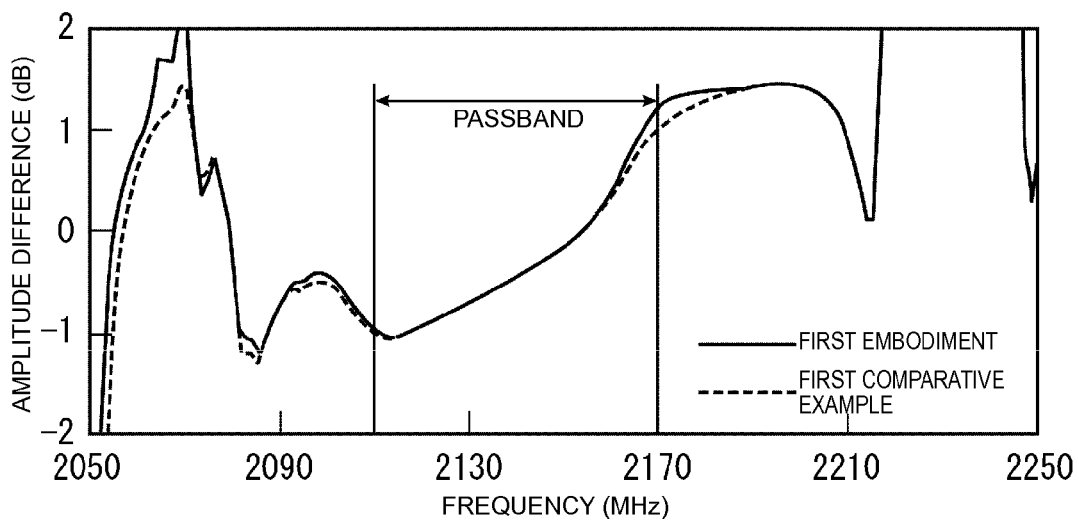
FIG. 5A is a diagram illustrating an amplitude difference between first and second balanced signal terminals of a reception filter of the duplexer according to the first preferred embodiment of the present invention and an amplitude difference between the first and second balanced signal terminals of a reception filter of the duplexer according to the first comparative example.
Figure 5B:
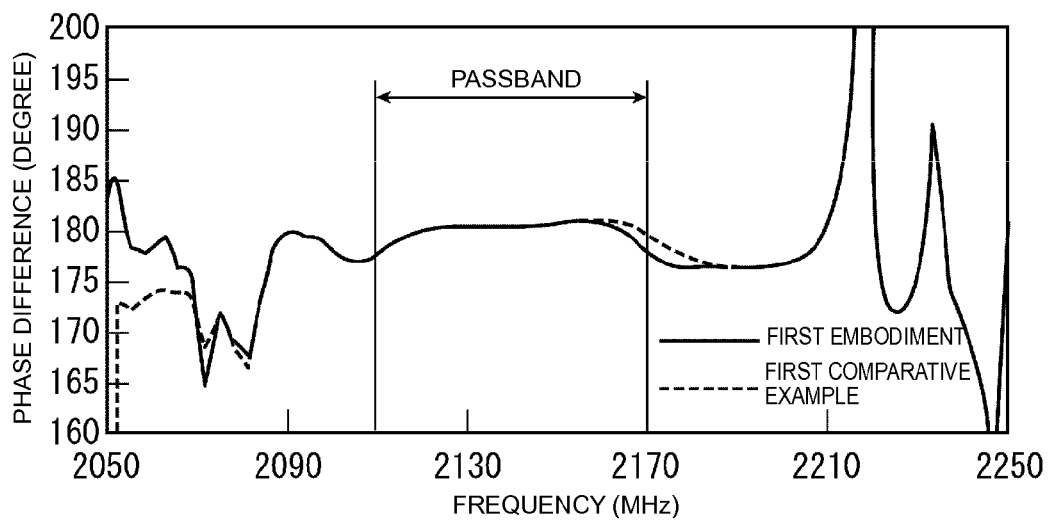
FIG. 5B is a diagram illustrating a phase difference between first and second balanced signal terminals of the reception filter of the duplexer according to the first preferred embodiment of the present invention and a phase difference between the first and second balanced signal terminals of the reception filter of the duplexer according to the first comparative example.

As described above, in the first preferred embodiment, when compared to the first comparative example, a large amount of attenuation on the lower side relative to the passband is obtained without deteriorating the insertion loss in the passband and the passband width. However, as shown in FIGS. 5A and 5B, the results of the amplitude difference and the phase difference are worse than those of the first comparative example. This is because a difference between signals output from the first and second balanced signal terminals 6 and 7 is relatively large due to the different number of the electrode fingers of the second IDTs 11b to 14b located in the middle of the IDTs 11b to 14b in the first to fourth longitudinally coupled resonator type surface acoustic wave filters 11 to 14.

Figure 6:
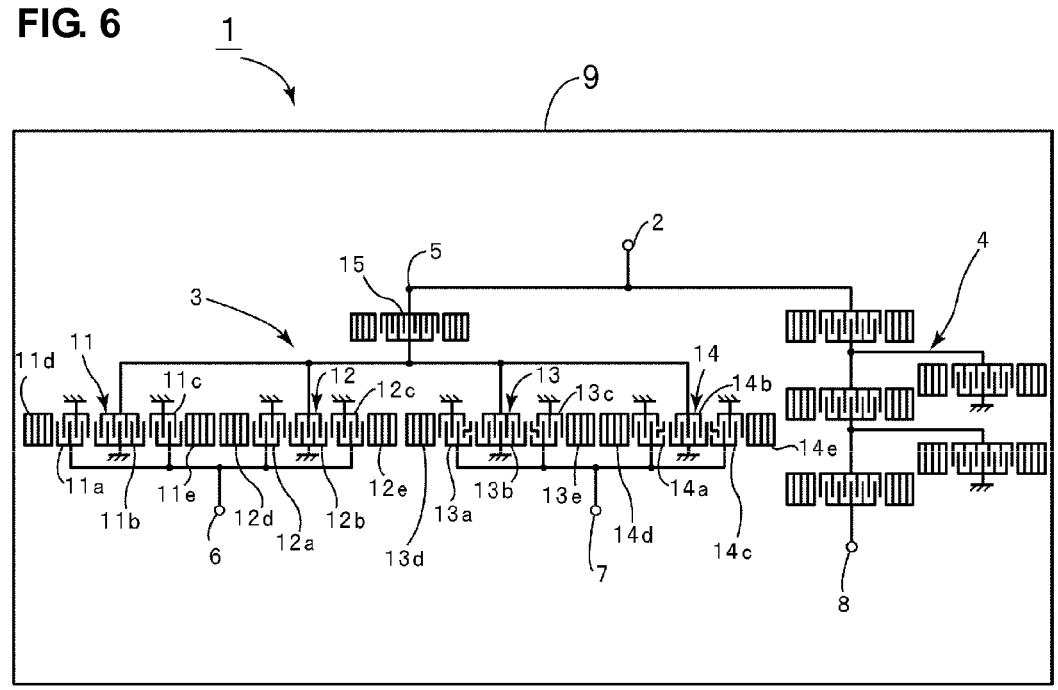
FIG. 6 is a plan view schematically illustrating a duplexer according to a second preferred embodiment of the present invention.

FIG. 6 is a plan view schematically illustrating an electrode configuration of a duplexer according to a second preferred embodiment of the present invention. The duplexer according to the second preferred embodiment has a configuration that is substantially the same as that of the first preferred embodiment except that the numbers of pairs of electrode fingers of middle IDTs of first to fourth longitudinally coupled resonator type surface acoustic wave filters 11 to 14 are different from those of the first preferred embodiment. Note that, the electrode fingers of the IDTs are schematically illustrated in FIGS. 1 and 6, and therefore, the numbers of pairs of the electrode fingers of the IDTs in FIGS. 1 to 6 are different from those described herein.

Since the second preferred embodiment differs from the first preferred embodiment only in that the numbers of pairs of the electrode fingers of the IDTs 11b to 14b are different from those of the first preferred embodiment, components which are substantially the same as those of the first preferred embodiment are designated by the same reference numerals in FIG. 6 to thereby incorporate the description of the first preferred embodiment.

In this preferred embodiment, the number of the electrode fingers of the second IDT 11b of the first longitudinally coupled resonator type surface acoustic wave filter 11 is 53 which is equal to the number of the electrode fingers of the middle IDT 13b of the third longitudinally coupled resonator type surface acoustic wave filter 13. Similarly, the number of the electrode fingers of the middle IDT 12b of the second longitudinally coupled resonator type surface acoustic wave filter 12 is 47 which is equal to the number of the electrode fingers of the middle second IDT 14b of the fourth longitudinally coupled resonator type surface acoustic wave filter 14. Other configurations are preferably similar to those of the first preferred embodiment, and a sample duplexer is manufactured and characteristics thereof are measured.

Figure 7:
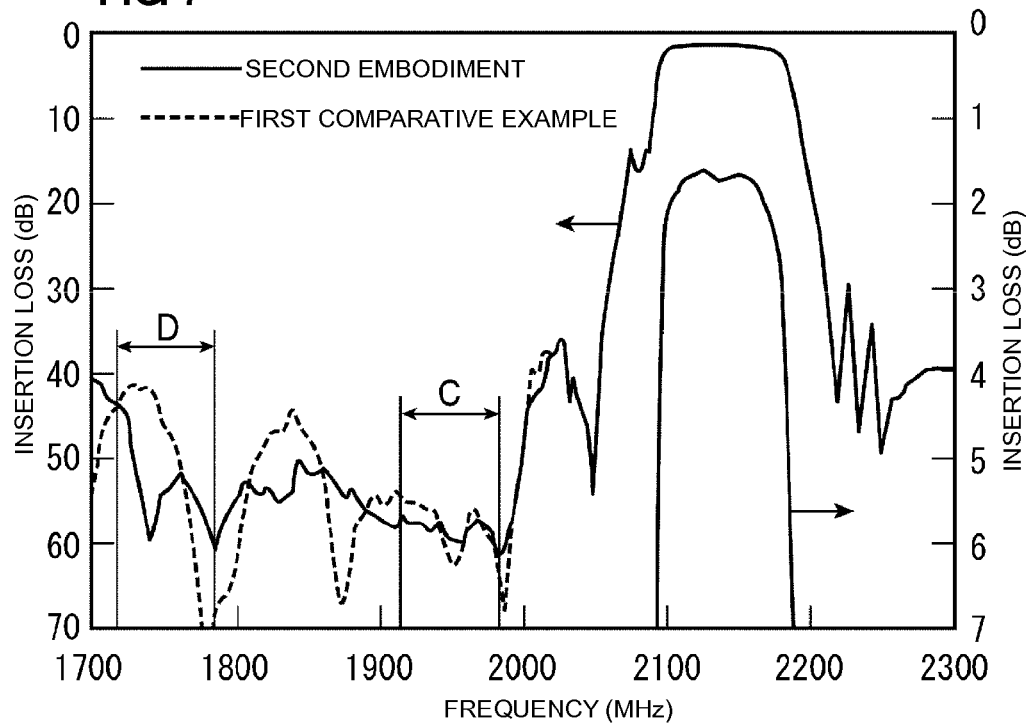
FIG. 7 is a diagram illustrating a transmission characteristic from an antenna terminal to a reception output terminal of the duplexer according to the second preferred embodiment of the present invention and the transmission characteristic from the antenna terminal to the reception output terminal of the duplexer according to the first comparative example.
Figure 8:
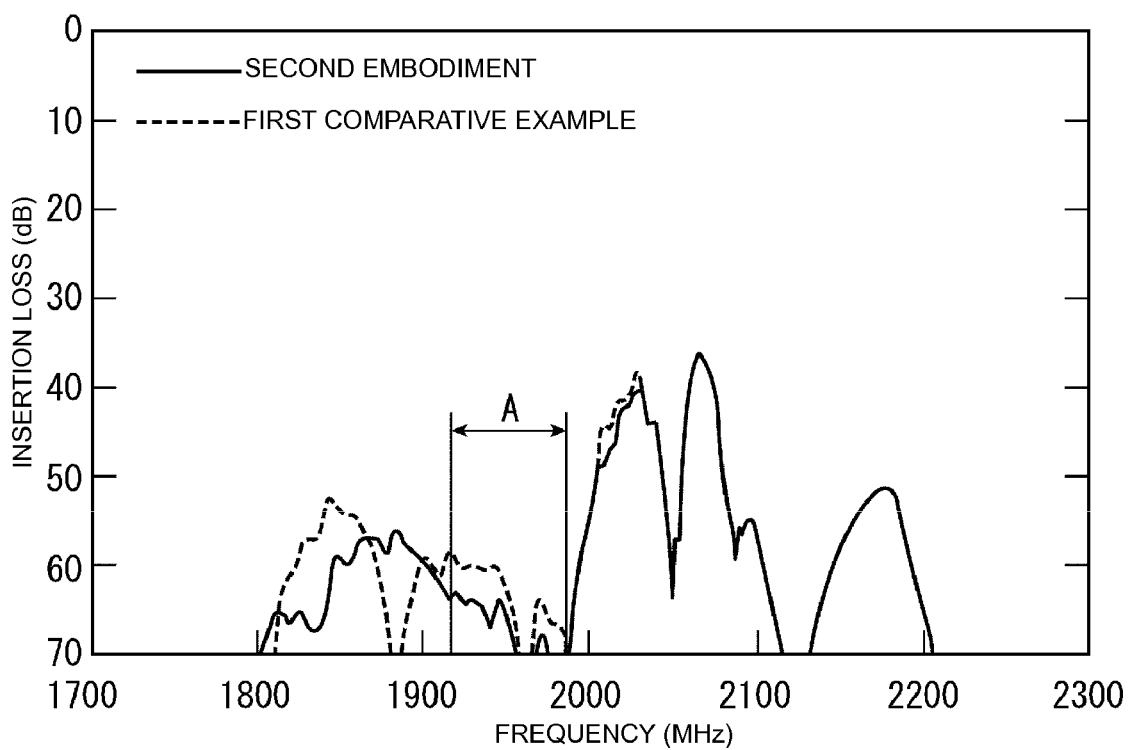
FIG. 8 is a diagram illustrating an isolation characteristic which is the transmission characteristic from a transmission input terminal to the reception output terminal of the duplexer according to the second preferred embodiment of the present invention and an isolation characteristic which is the characteristic of the transmission from the transmission input terminal to the reception output terminal of the duplexer according to the first comparative example.
Figure 9A:
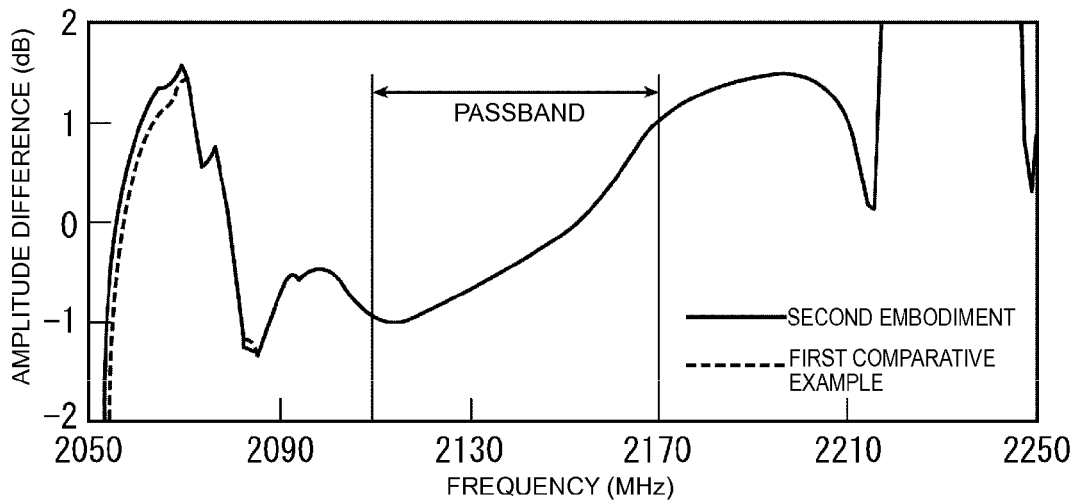
FIG. 9A is a diagram illustrating an amplitude difference between first and second balanced signal terminals of a reception filter of the duplexer according to the second preferred embodiment of the present invention and the amplitude difference between the first and second balanced signal terminals of a reception filter of the duplexer according to the first comparative example.
Figure 9B:
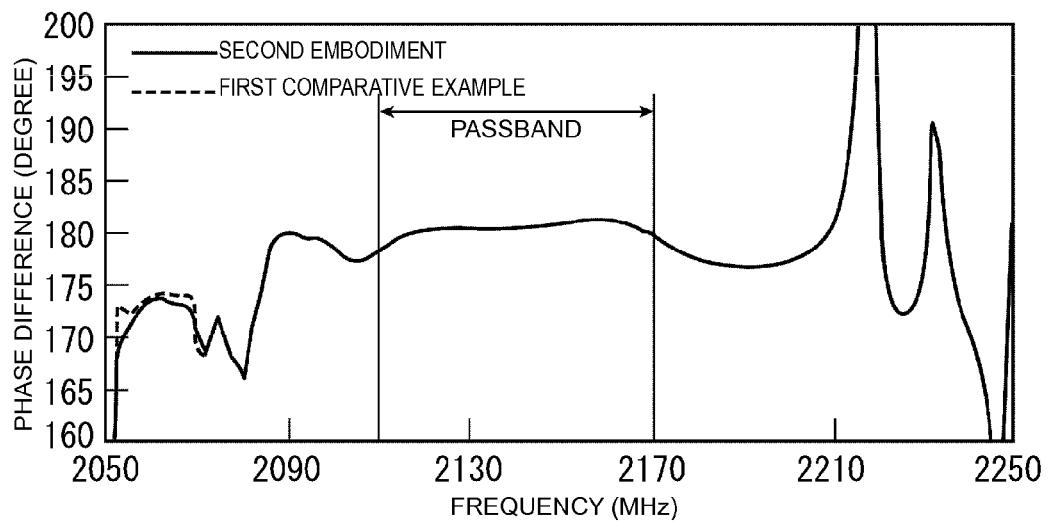
FIG. 9B is a diagram illustrating a phase difference between the first and second balanced signal terminals of the reception filter of the duplexer according to the second preferred embodiment of the present invention and a phase difference between the first and second balanced signal terminals of the reception filter of the duplexer according to the first comparative example.

Referring to FIG. 7, a characteristic of a propagation from an antenna terminal to first and second balanced signal terminals defining reception output terminals according to the second preferred embodiment is denoted by a solid line, and the same according to the first comparative example is denoted by a dashed line. FIG. 8 shows an isolation characteristic which is a characteristic of a propagation from a transmission input terminal to the reception output terminals according to the second preferred embodiment. FIGS. 9A and 9B show amplitude differences and phase differences between the balanced signal terminals. Similarly, in FIGS. 8, 9A and 9B, the results of the second preferred embodiment are denoted by solid lines and the results of the first comparative example are denoted by dashed lines.

As shown in FIG. 7, a difference between an insertion loss in a passband of the second preferred embodiment and the insertion loss in the passband of the first comparative example and a difference between a passband width of the second preferred embodiment and the passband width of the first comparative example are negligible. Furthermore, as shown in FIGS. 9A and 9B, unlike the first preferred embodiment, the amplitude difference and the phase difference of the second preferred embodiment are similar to those of the first comparative example. This is because, in the second preferred embodiment, the number of the pairs of the electrode fingers of the second IDT 11b in the middle of the first longitudinally coupled resonator type surface acoustic wave filter 11 is equal to the number of the pairs of the electrode fingers of the second IDT 13b in the middle of the third longitudinally coupled resonator type surface acoustic wave filter 13, and in addition, the number of the pairs of the electrode fingers of the second IDT 12b of the second longitudinally coupled resonator type surface acoustic wave filter 12 is equal to the number of the pairs of the electrode fingers of the second IDT 14b of the fourth longitudinally coupled resonator type surface acoustic wave filter 14. That is, since the sum of the number of the pairs of the electrode fingers of the IDTs 11b and 12b which transmit signals to the first balanced signal terminal 6 is equal to the sum of the number of the pairs of the electrode fingers of the IDTs 13b and 14b which transmit signals to the second balanced signal terminal 7, a difference between signals output from the first and second balanced signal terminals 6 and 7 is substantially the same as that of the first comparative example.

As described above, in each of the first and second preferred embodiments, the surface acoustic wave filter device on a reception side is configured so as to have a balanced-to-unbalanced conversion function using the first to fourth longitudinally coupled resonator type surface acoustic wave filters 11 to 14, and the number of pairs of electrode fingers of at least one of the IDTs of a corresponding at least one of the longitudinally coupled resonator type surface acoustic wave filters 11 to 14 is different from the number of pairs of electrode fingers of the IDTs of the other remaining longitudinally coupled resonator type surface acoustic wave filters. Accordingly, a large amount of attenuation in a lower frequency band relative to the passband is obtained. In this case, as described in the second preferred embodiment, the amplitude difference and the phase difference between the first and second balanced signal terminals 6 and 7 can be suppressed by setting the number of the pairs of the electrode fingers of the IDTs which transmit signals to the first balanced signal terminals 6 to be equal to the number of the pairs of the electrode fingers of the IDTs which transmit signals to the second balanced signal terminals 7.

Figure 10:
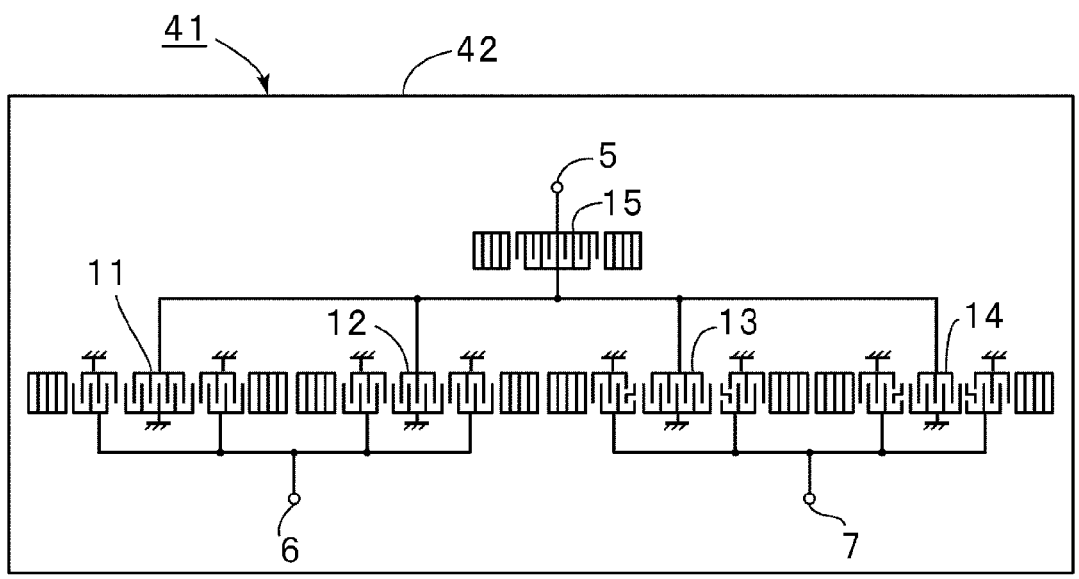
FIG. 10 is a plan view schematically illustrating an interstage filter including the surface acoustic wave filter device according to the first preferred embodiment of the present invention.

Note that, in each of the first and second preferred embodiments, the surface acoustic wave filter device 3 having the balanced-to-unbalanced conversion function is combined with the transmission filter so as to define the balanced duplexer. However, the acoustic wave filter device according to the preferred embodiments of the present invention may be applicable to usages other than the duplexer. FIG. 10 is a plan view schematically illustrating an example of an interstage filter including the surface acoustic wave filter device 3 shown in FIG. 1. An interstage filter 41 is preferably configured such that an electrode configuration shown in the drawing is provided on a piezoelectric substrate 42. The electrode configuration is substantially the same as that of the surface acoustic wave filter device 3 shown in FIG. 1. Therefore, components which are similar to those of the surface acoustic wave filter device 3 of FIG. 1 are designated by the same reference numerals, and description thereof is omitted.

Figure 11:
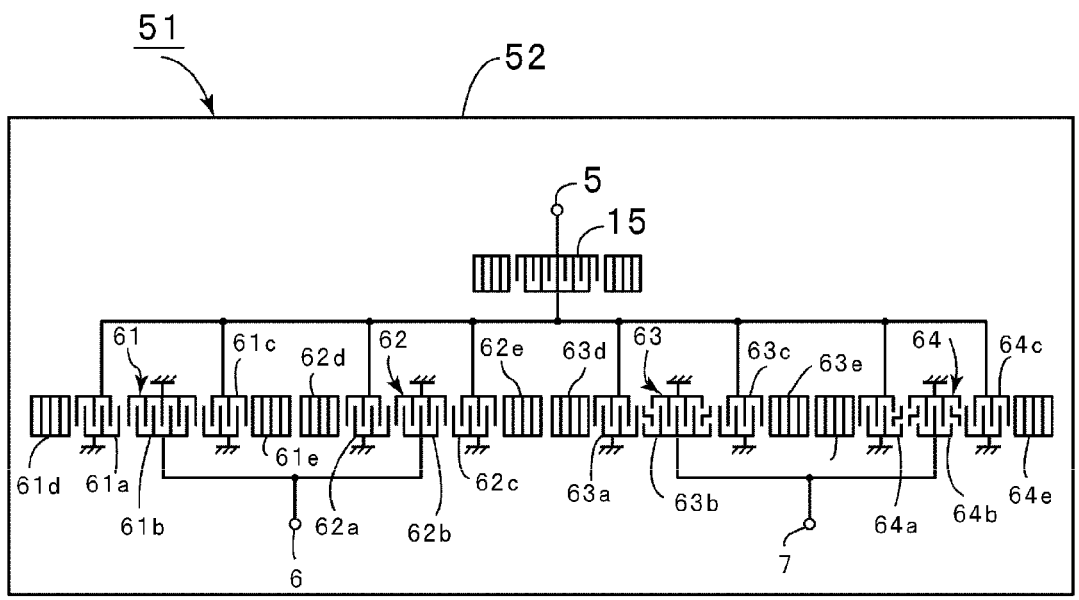
FIG. 11 is a plan view schematically illustrating a modification of the surface acoustic wave filter device according to the first preferred embodiment of the present invention.

FIG. 11 is a plan view schematically illustrating a modification of the longitudinally coupled resonator type surface acoustic wave filter device 3 according to the first and second preferred embodiments of the present invention. In a surface acoustic wave filter device 51 of this modification, an electrode configuration is provided on a piezoelectric substrate 52 as shown in the drawing. Here, first to fourth longitudinally coupled resonator type surface acoustic wave filters 61 to 64 are arranged. The first to fourth longitudinally coupled resonator type surface acoustic wave filters 61 to 64 have first to third IDTs 61a to 61c, first to third IDTs 62a to 62c, first to third IDTs 63a to 63c, and first to third IDTs 64a to 64c which are arranged in a surface wave propagation direction. A region including the IDTs 61a to 61c is sandwiched between reflectors 61d and 61e in the surface wave propagation direction. Similarly, the other longitudinally coupled resonator type surface acoustic wave filter devices 62 to 64 include reflectors 62d and 62e, reflectors 63d and 63e, and reflectors 64d and 64e, respectively.

In the first to fourth longitudinally coupled resonator type surface acoustic wave filters 61 to 64, first ends of the first and third IDTs 61a and 61c, the first and third IDTs 62a and 62c, the first and third IDTs 63a and 63c, and the first and third IDTs 64a and 64c which are arranged on both sides of the first to fourth longitudinally coupled resonator type surface acoustic wave filters 61 to 64 are connected to one another and further connected through a one-port type surface acoustic wave resonator 15 to an unbalanced signal terminal 5, and second ends of the first and third IDTs 61a and 61c, the first and third IDTs 62a and 62c, the first and third IDT 63a and 63c, and the first and third IDTs 64a and 64c are connected to a ground potential. Then, first ends of the second IDTs 61b and 62b arranged in the middle of the first and second longitudinally coupled resonator type surface acoustic wave filters 61 to 62, respectively, are connected to each other and further connected to a first balanced signal terminal 6, and second ends of the second IDTs 61b and 62b are connected to the ground potential. Similarly, first ends of the second IDTs 63b and 64b arranged in the middle of the third and fourth longitudinally coupled resonator type surface acoustic wave filters 63 to 64, respectively, are connected to each other and further connected to a second balanced signal terminal 7, and second ends of the second IDTs 63b and 64b are connected to the ground potential. That is, as shown in FIG. 11, the second IDTs 61b, 62b, 63b, and 64b arranged in the middle of the first to fourth longitudinally coupled resonator type surface acoustic wave filters 61 to 64 may preferably be connected to the balanced signal terminals, and the first and third IDTs arranged on both sides of the first to fourth longitudinally coupled resonator type surface acoustic wave filters 61 to 64 may be connected to the unbalanced signal terminal.

Other configurations of the surface acoustic wave filter device 51 are preferably similar to those of the surface acoustic wave filter device 3.

Figure 12:
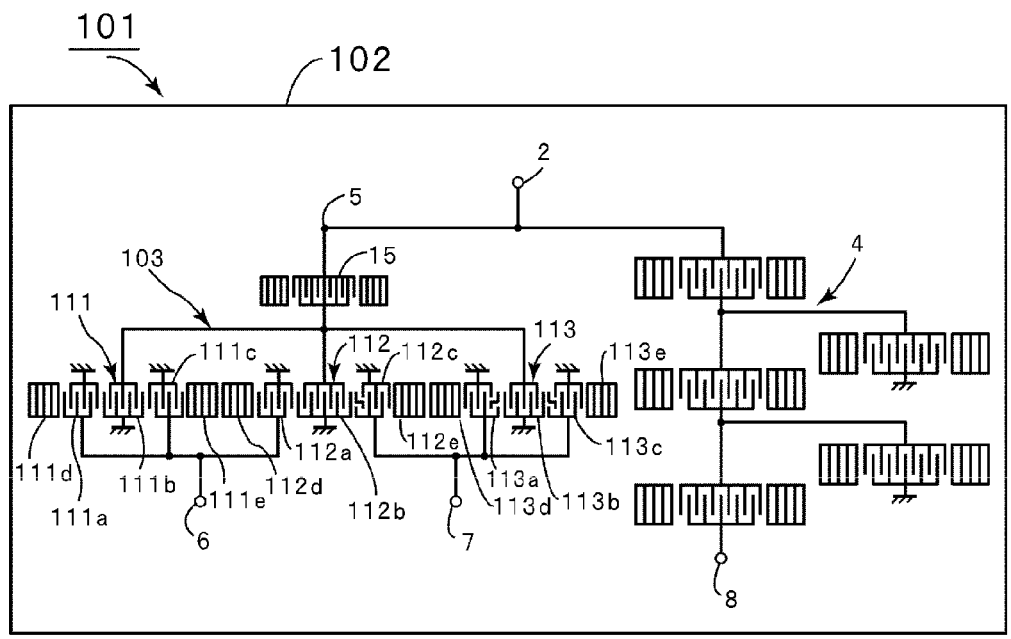
FIG. 12 is a plan view schematically illustrating a duplexer according to a third preferred embodiment of the present invention.

FIG. 12 is a plan view schematically illustrating a duplexer according to a third preferred embodiment of the present invention. A duplexer 101 according to the third preferred embodiment includes a piezoelectric substrate 102. As with the first preferred embodiment, the piezoelectric substrate 102 is preferably defined by 40±5° Y-cut X-propagation LiTaO$_3$, for example. The duplexer 101 of the third preferred embodiment is substantially the same as that of the first preferred embodiment except that a surface acoustic wave filter device 103 on a reception side is different from the surface acoustic wave filter device 3 on the reception side of the first preferred embodiment. Therefore, components which are similar to those of the surface acoustic wave filter device 3 shown in FIG. 1 are designated by the same reference numerals, and description thereof is omitted.

The duplexer 101 of this preferred embodiment is also a balanced duplexer employing a WCDMA system, and includes an antenna terminal 2, unbalanced signal terminal 5, first and second balanced signal terminals 6 and 7, and a transmission terminal 8.

In this preferred embodiment, a surface acoustic wave filter device 103 defining a reception filter includes a one-port type surface acoustic wave resonator 15 connected to the unbalanced signal terminal 5. Then, first to third longitudinally coupled resonator type surface acoustic wave filters 111 to 113 are arranged so as to be connected to the unbalanced signal terminal 5 through the one-port type surface acoustic wave resonator 15. The first to third longitudinally coupled resonator type surface acoustic wave filters 111 to 113 include first to third IDTs 111a to 111c, first to third IDTs 112a to 112c, and first to third IDTs 113a to 113c, respectively, which are arranged in a surface wave propagation direction. A region including the three IDTs 111a to 111c is sandwiched between reflectors 111d and 111e in the surface wave propagation direction. Similarly, the second and third longitudinally coupled resonator type surface acoustic wave filters 112 and 113 include reflectors 112d and 112e and reflectors 113d and 113e, respectively.

In the third preferred embodiment, first ends of the second IDTs 111b to 113b arranged in the middle of the first to third longitudinally coupled resonator type surface acoustic wave filters 111 to 113 are connected to one another and further connected to the unbalanced signal terminal 5 through the one-port type surface acoustic wave resonator 15, and second ends of the IDTs 111b to 113b are connected to a ground potential.

Furthermore, first ends of the first and third IDTs 111a and 111c of the first longitudinally coupled resonator type surface acoustic wave filter 111 and a first end of the first IDT 112a of the second longitudinally coupled resonator type surface acoustic wave filter unit are connected to one another and further connected to the first balanced signal terminal 6, and second ends of the IDTs 111a, 111c and 112a are connected to the ground potential.

A first end of the third IDT 112c of the second longitudinally coupled resonator type surface acoustic wave filter 112 and first ends of the first and third IDTs 113a and 113c of the third longitudinally coupled resonator type surface acoustic wave filter 113 are connected to one another and further connected to the second balanced signal terminal 7, and second ends of the IDTs 112c, 113a and 113c are connected to the ground potential.

Then, the polarities of the IDT 112c, 113a, and 113c are inverted relative to the polarities of the IDTs 111a, 111c, and 112a such that a phase of a signal output from the IDTs 111a, 111c, and 112a differs by about 180 degrees with respective to a phase of a signal output from the IDTs 112c, 113a, and 113c. With this configuration, a balanced-to-unbalanced conversion function is achieved. Note that a configuration in which polarities of the IDTs are controlled such that a phase of a signal output from the first balanced signal terminal 6 in response to a signal input on the first balanced signal terminal 6 differs by about 180 degrees with respect to a phase of a signal output from the second balanced signal terminal 7 in response to a signal input on the second balanced signal terminal 7 is not limited to the configuration shown in the drawing, and any suitable configuration may be used.

As in the first preferred embodiment, the balance is improved by a series weighting method in this preferred embodiment. That is, a first side-end of the IDTs 112c which is closer to the second IDT 112b and first side-ends of the IDTs 113a and 113c which are closer to the second IDT 113b are preferably subjected to series weighting.

In this preferred embodiment, as described above, in the surface acoustic wave filter device 103 including the first to third longitudinally coupled resonator type surface acoustic wave filters 111 to 113 connected as described above such that the balanced-to-unbalanced conversion function is achieved, the number of pairs of electrode fingers of the IDTs of at least one of the first to third longitudinally coupled resonator type surface acoustic wave filters 111 to 113 is different from the number of pairs of electrode fingers of corresponding IDTs of the other ones of the first to third longitudinally coupled resonator type surface acoustic wave filters. Accordingly, an increased amount of an out-of-band attenuation can be obtained without deteriorating the balance. This will become apparent from a detailed description of the results of an experiment of the third preferred embodiment as an experimental example.

The first longitudinally coupled resonator type surface acoustic wave filter 111 is designed using the following parameters. Note that a wavelength determined by a pitch between the electrode fingers of the IDTs is λI.

Crossing width of the electrode fingers: about 28.8 λI
The number of electrode fingers in each of the first and third IDTs 11a and 11c: 29
The number of electrode fingers in the second IDT 11b: 51
The number of electrode fingers in the reflectors 11d and 11e: 65
Metallization ratio: about 0.67
Electrode film thickness: about 0.106 λI The second longitudinally coupled resonator type surface acoustic wave filter 112 is configured using similar design parameters as those used for the first longitudinally coupled resonator type surface acoustic wave filter 111, except that the IDT 112c is inverted relative to the IDT 111c, the series weighting is performed on the IDT 112c, and the number of electrode fingers of the middle IDT 113b is 57.

The third longitudinally coupled resonator type surface acoustic wave filter 113 is configured using the design parameters as those used for the first longitudinally coupled resonator type surface acoustic wave filter 111, except that the first and third IDTs 113a and 113c are inverted relative to the first and third IDTs 111a and 111c of the first longitudinally coupled resonator type surface acoustic wave filter, and the series weighting is performed on the first and third IDTs 113a and 113c.

The surface acoustic wave resonator 15 is designed using the following parameters assuming that a wavelength determined by a pitch between the electrode fingers of the IDTs is λI.

Crossing width of the electrode fingers: about 14.6 λI
The number of electrode fingers in an IDT: 241
The number of electrode fingers in a reflector: 15
Metallization ratio: about 0.58
Electrode film thickness: about 0.109 λI Note that, although only the single surface acoustic wave resonator 15 is shown in FIG. 12, three surface acoustic wave resonators designed as described above are preferably connected in series in this preferred embodiment.

Figure 13:
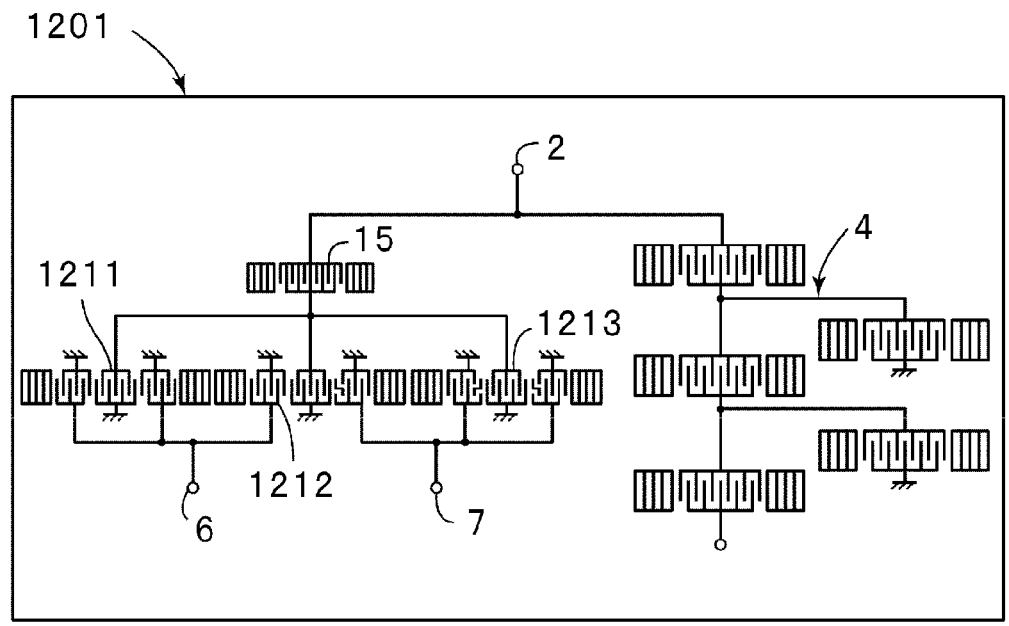
FIG. 13 is a plan view schematically illustrating a duplexer according to a second comparative example.

The duplexer 101 including the surface acoustic wave filter device 103 configured as described above and defining a reception filter is manufactured. A duplexer 1201 shown in FIG. 13 is provided for comparison. The duplexer 1201 of a second comparative example is substantially the same as that of the third preferred embodiment except that the number of pairs of electrode fingers of IDTs arranged in the middle of each of the first to third longitudinally coupled resonator type surface acoustic wave filters 1211 to 1213 is 53.

Figure 14:
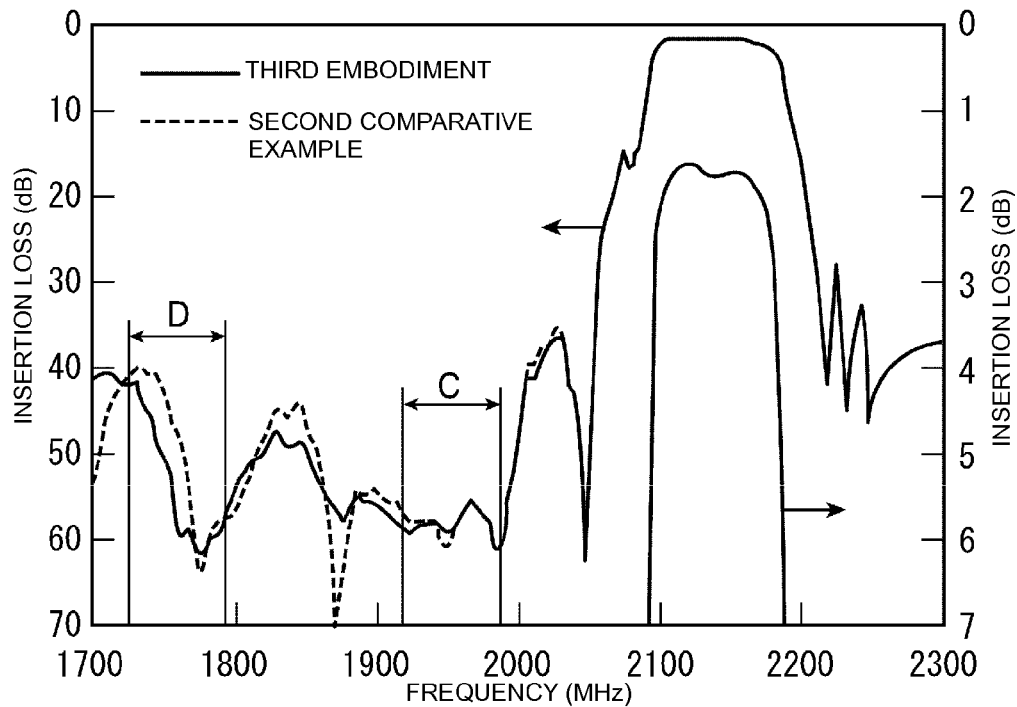
FIG. 14 is a diagram illustrating a transmission characteristic from an antenna terminal to a reception output terminal of the duplexer according to the third preferred embodiment of the present invention and a transmission characteristic from an antenna terminal to a reception output terminal of the duplexer according to the second comparative example.
Figure 15:
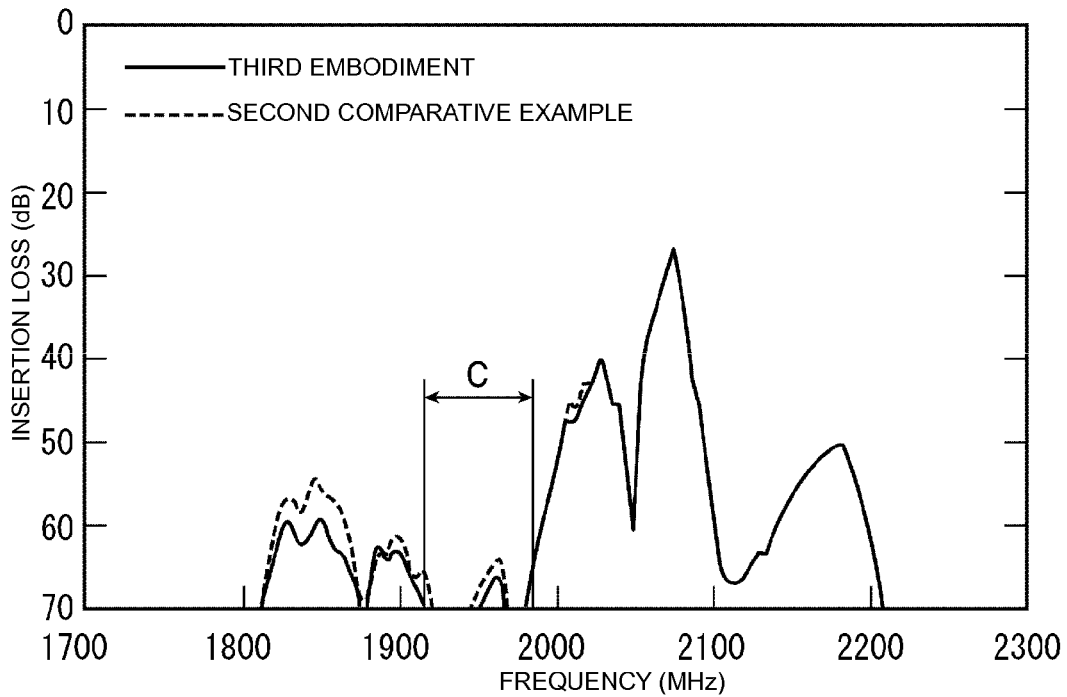
FIG. 15 is a diagram illustrating an isolation characteristic which is a transmission characteristic from a transmission input terminal to the reception output terminal of the duplexer according to the third preferred embodiment of the present invention and an isolation characteristic which is a transmission characteristic from a transmission input terminal to the reception output terminal of the duplexer according to the second comparative example.
Figure 16A:
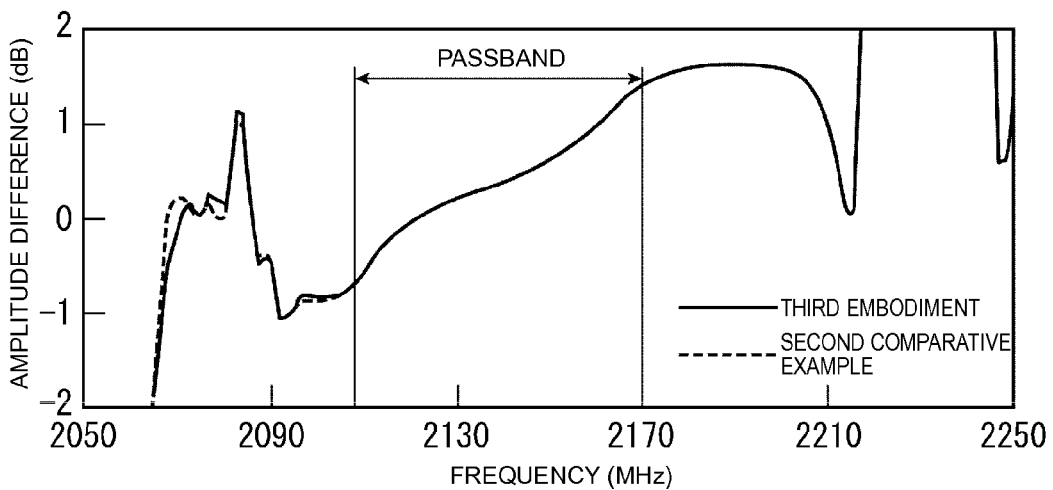
FIG. 16A is a diagram illustrating an amplitude difference between first and second balanced signal terminals of a reception filter of the duplexer according to the third preferred embodiment of the present invention and an amplitude difference between the first and second balanced signal terminals of a reception filter of the duplexer according to the second comparative example.
Figure 16B:
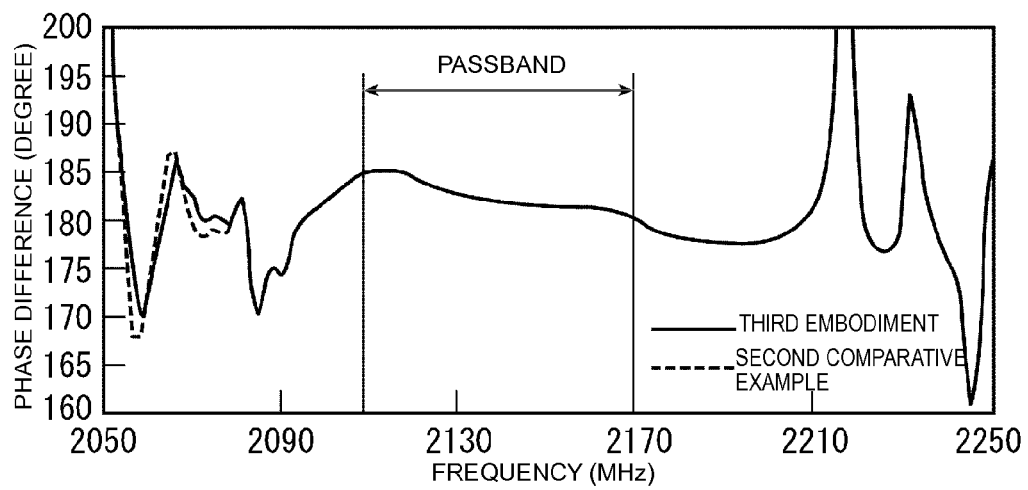
FIG. 16B is a diagram illustrating a phase difference between first and second balanced signal terminals of the reception filter of the duplexer according to the third preferred embodiment of the present invention and a phase difference between the first and second balanced signal terminals of the reception filter of the duplexer according to the second comparative example.

FIG. 14 shows transmission characteristics from the antenna terminals to the first and second reception output terminals according to the third preferred embodiment and the second comparative example. FIG. 15 shows isolation characteristics which are transmission characteristics from the transmission input terminals to the reception output terminals. FIGS. 16A and 16B show amplitude differences and phase differences, respectively, between the balanced signal terminals. In FIGS. 13 to 16B, solid lines denote the results of the third preferred embodiment, and dashed lines denote the results of the second comparative example.

As shown in FIG. 14, an attenuation in a transmission frequency band C located on a lower side relative to a passband of the second comparative example is about 56.0 dB, whereas an attenuation in the transmission frequency band C located on a lower side relative to the passband of the third preferred embodiment is about 57.0 dB, which is improved by about 1.0 dB.

An attenuation in the 2Tx-Rx band D described above in the second comparative example is substantially the same that in the third preferred embodiment. As shown in FIG. 14, an insertion loss and a passband width of the third preferred embodiment are substantially the same as those of the second comparative example. Furthermore, a difference between the isolation characteristics of the third preferred embodiment and the second comparative example is negligible as shown in FIG. 15. The amplitude difference and the phase difference of the third preferred embodiment are also substantially the same as those of the second comparative example as shown in FIGS. 16A and 16B. That is, an increased amount of attenuation in the transmission frequency band is obtained without deteriorating the other electric characteristics. A reason for this is similar to that of the first preferred embodiment.

As described above, in the third preferred embodiment, in the surface acoustic wave filter device including the three longitudinally coupled resonator type surface acoustic wave filters connected as described above so that a balanced-to-unbalanced conversion function is achieved, the number of pairs of electrode fingers of the IDTs of at least one of the longitudinally coupled resonator type surface acoustic wave filters is different from the number of pairs of electrode fingers of corresponding IDTs of the other remaining longitudinally coupled resonator type surface acoustic wave filters. Accordingly, an increased amount of attenuation in the frequency band lower than the passband can be obtained without deteriorating the balance.

Figure 17:
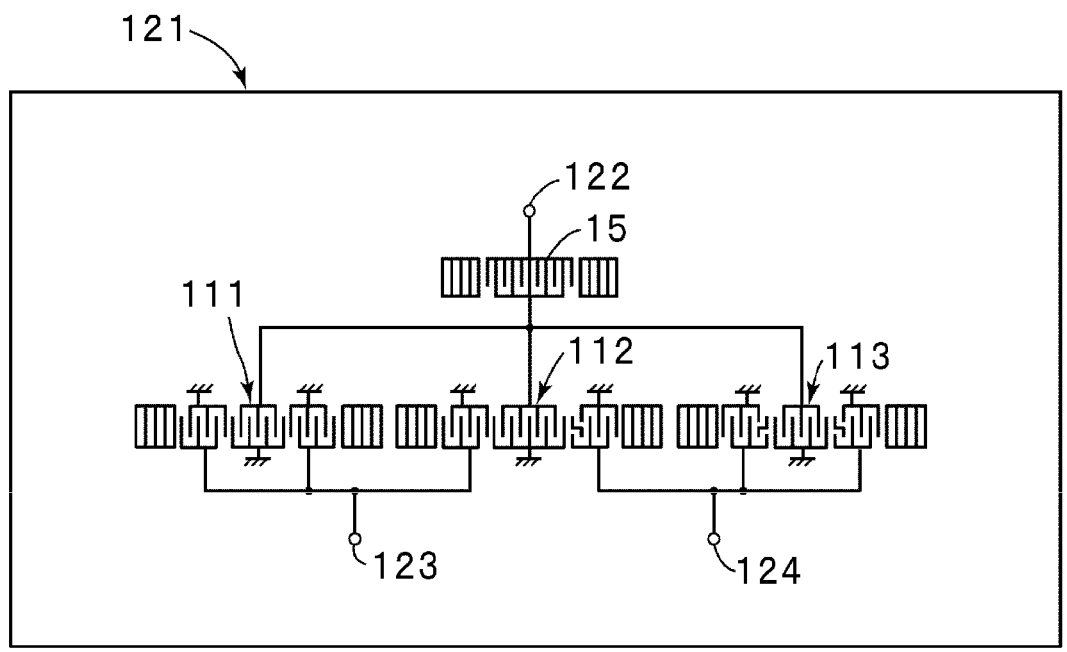
FIG. 17 is a plan view schematically illustrating an interstage filter including the surface acoustic wave filter device according to the third preferred embodiment of the present invention.

Note that although the duplexer 101 includes the surface acoustic wave filter device 103 as the reception filter, an interstage filter 121 schematically shown in a plan view of FIG. 17 may preferably be defined by the surface acoustic wave filter device 103. That is, in the interstage filter 121, a configuration that is substantially the same as the configuration of the surface acoustic wave filter device 103 is connected between an input terminal 122 and first and second balanced signal terminals 123 and 124 such that the interstage filter 121 is obtained. That is, the surface acoustic wave filter device 103 may preferably be used as not only a duplexer but also an interstage filter including a combination of longitudinally coupled resonator type surface acoustic wave filters and a surface acoustic wave resonator.

Figure 18:
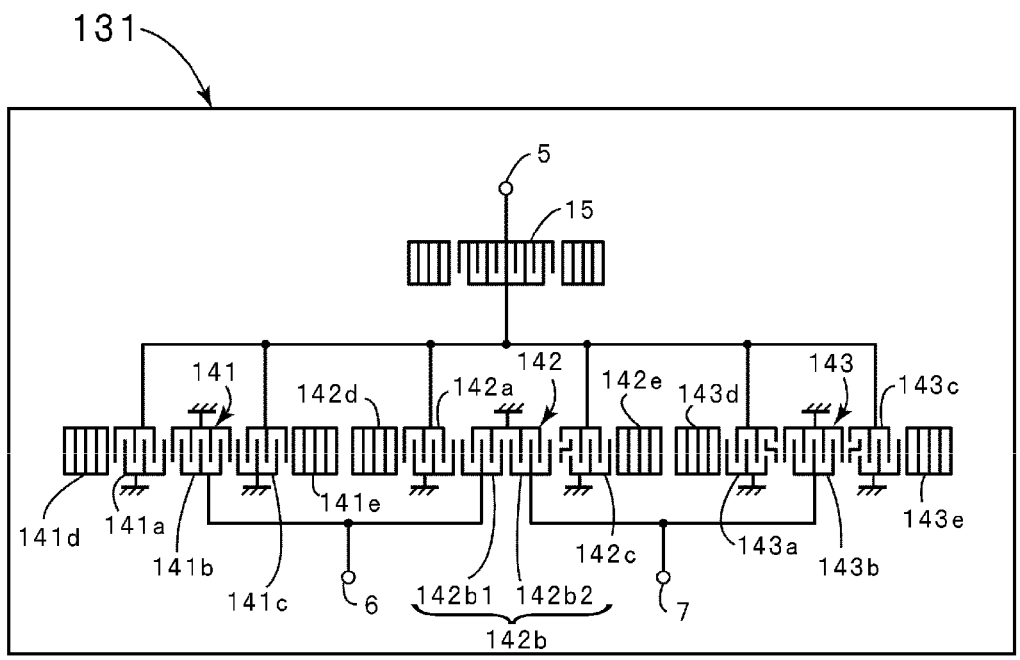
FIG. 18 is a plan view schematically illustrating a modification of the surface acoustic wave filter device according to the third preferred embodiment of the present invention.
Figure 19:
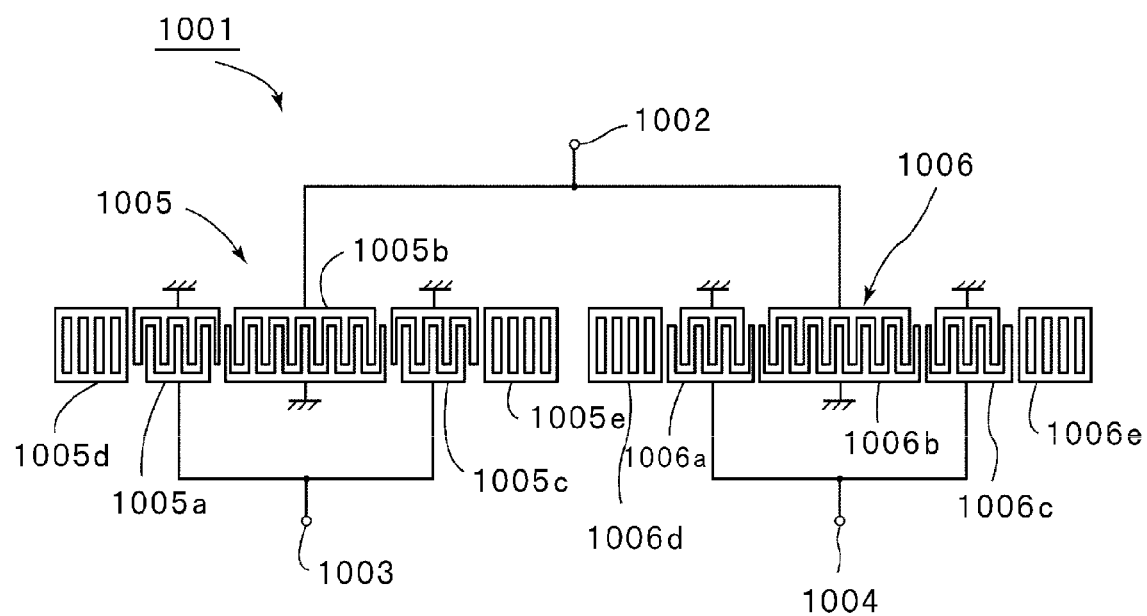
FIG. 19 is a plan view schematically illustrating an example of a conventional surface acoustic wave filter device.

FIG. 18 is a plan view schematically illustrating a modification of the surface acoustic wave filter device according to the third preferred embodiment. In first to third longitudinally coupled resonator type surface acoustic wave filters 141 to 143 of a surface acoustic wave filter device 131 of this modification, first ends of first and third IDTs 141a and 141c, first and third IDTs 142a and 142c, and first and third IDTs 143a and 143c, which are arranged on both sides of the first to third longitudinally coupled resonator type surface acoustic wave filters 141 to 143, respectively, in a surface wave propagation direction, are connected to one another and further connected to an unbalanced signal terminal 5 through a one-port type surface acoustic wave resonator 15.

In the second longitudinally coupled resonator type surface acoustic wave filter 142, a second IDT 142b arranged in the middle of the second longitudinally coupled resonator type surface acoustic wave filter 142 is divided in two in the surface wave propagation direction such that a first sub-IDT portion 142b1 and a second sub-IDT portion 142b2 are obtained. The IDT 141b arranged in the middle of the first longitudinally coupled resonator type surface acoustic wave filter 141 and the first sub-IDT portion 142b1 are connected to each other and further connected to a first balanced signal terminal 6. The other end of the IDT 142b is connected to a ground potential. A first end of the second sub-IDT portion 142b2 and a first end of the second IDT 143b arranged in the middle of the third longitudinally coupled resonator type surface acoustic wave filter 143 are connected to each other and further connected to a second balanced signal terminal 7. A second end of the IDT 143b is connected to the ground potential. One end of the second longitudinally coupled resonator type surface acoustic wave filter 142 is also connected to the ground potential.

As described above, in the first to third longitudinally coupled resonator type surface acoustic wave filters 141 to 143, the first and third IDTs can preferably be connected to the unbalanced signal terminal 5, the second IDTs arranged in the middle are connected to the balanced signal terminals 6 and 7. In this case, as in the third preferred embodiment, the number of pairs of electrode fingers of the IDT located in the middle of at least one of the first and third longitudinally coupled resonator type surface acoustic wave filters is different from the number of pairs of electrode fingers of the IDTs of the other remaining longitudinally coupled resonator type surface acoustic wave filters. Accordingly, an increased amount of out-of-band attenuation can be obtained without deteriorating balance.

In particular, since the second IDT 142b arranged in the middle of second longitudinally coupled resonator type surface acoustic wave filter 142 is divided in two, the number of electrode fingers of the IDT 142b should preferably be an even number. On the other hand, since the numbers of electrode fingers of the second IDTs 141b and 143b arranged in the middle of the IDTs 141 and 143, respectively, are preferably odd numbers, the numbers of the electrode fingers of the IDTs 141b and 143b are different from the number of the electrode fingers of the IDT 142. Therefore, in the third preferred embodiment, in order to sufficiently achieve an increased amount of out-of-band attenuation, the number of the pairs of the electrode fingers of the IDTs 141b and 143b included in the first and third longitudinally coupled resonator type surface acoustic wave filters 141 and 143 should preferably be different from the number of electrode fingers of the IDT 142b by at least two electrode fingers.

Note that although the surface acoustic wave filter devices are described in the first to third preferred embodiments, the present invention is not limited to devices which utilize surface acoustic waves, and may preferably be an acoustic wave device which utilizes other acoustic waves, such as boundary acoustic waves, for example. That is, an electrode configuration substantially the same as that in the preferred embodiments of the present invention described above may preferably be provided on an interface between a piezoelectric substance and a dielectric substance to thereby define an acoustic boundary wave filter device.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An acoustic wave filter device, comprising:
a piezoelectric substrate;
first to fourth longitudinally coupled resonator type acoustic wave filters, each of which includes first to third IDTs arranged on the piezoelectric substrate in an acoustic wave propagation direction;
an unbalanced signal terminal connected to input terminals of the first to fourth longitudinally coupled resonator type acoustic wave filters;
a first balanced signal terminal connected to output terminals of the first and second longitudinally coupled resonator type acoustic wave filters; and
a second balanced signal terminal connected to output terminals of the third and fourth longitudinally coupled resonator type acoustic wave filters; wherein
a phase of an output signal of the first longitudinally coupled resonator type acoustic wave filter relative to an input signal is substantially the same as a phase of an output signal of the second longitudinally coupled resonator type acoustic wave filter relative to an input signal;
a phase of an output signal of the third longitudinally coupled resonator type acoustic wave filter relative to an input signal is substantially the same as a phase of an output signal of the fourth longitudinally coupled resonator type acoustic wave filter relative to an input signal;
the phase of the output signal of the first longitudinally coupled resonator type acoustic wave filter relative to the input signal differs by about 180 degrees with respect to the phase of the output signal of the third longitudinally coupled resonator type acoustic wave filter relative to the input signal; and
a number of pairs of electrode fingers of at least one of the IDTs of at least one of the first to fourth longitudinally coupled resonator type acoustic wave filters is different from a number of pairs of electrode fingers of the IDTs of the first to fourth longitudinally coupled resonator type acoustic wave filters other than the at least one of the first to fourth longitudinally coupled resonator type acoustic wave filters.

2. The acoustic wave filter device according to claim 1, wherein, when a sum of the number of pairs of electrode fingers of the first to third IDTs of each of the first to fourth longitudinally coupled resonator type acoustic wave filters is defined as a total number of pairs, the total number of pairs of the first longitudinally coupled resonator type acoustic wave filter is equal to the total number of pairs of the third longitudinally coupled resonator type acoustic wave filter, the total number of pairs of the second longitudinally coupled resonator type acoustic wave filter is equal to the total number of pairs of the fourth longitudinally coupled resonator type acoustic wave filter, and the total number of pairs of the first longitudinally coupled resonator type acoustic wave filter is different from the total number of pairs of the second longitudinally coupled resonator type acoustic wave filter.

3. The acoustic wave filter device according to claim 1, wherein the piezoelectric substrate is a defined by a 40±5° Y-cut X-propagation $LiTaO_3$ substrate.

4. A duplexer comprising a transmission filter and a reception filter including the acoustic wave filter device according to claim 1.

5. An acoustic wave filter device, comprising:
a piezoelectric substrate;
first to third longitudinally coupled resonator type acoustic wave filters, each of which includes first to third IDTs arranged on the piezoelectric substrate in an acoustic wave propagation direction; and
an unbalanced signal terminal connected to input terminals of the first to third longitudinally coupled resonator type acoustic wave filters and first and second balanced signal terminals; wherein
a phase of an output signal of the first longitudinally coupled resonator type acoustic wave filter relative to an input signal differs by about 180 degrees with respect to a phase of an output signal of the third longitudinally coupled resonator type acoustic wave filter relative to an input signal;
the second longitudinally coupled resonator type acoustic wave filter includes first and second output terminals, and a phase of a signal output from the first output terminal relative to an input signal differs by about 180 degrees with respect to a phase of a signal output from the second output terminal relative to an input signal;
the phase of the signal output from an output terminal of the first longitudinally coupled resonator type acoustic wave filter relative to the input signal is substantially the same as the phase of the signal output from the first output terminal of the second longitudinally coupled resonator type acoustic wave filter relative to the input signal;
a phase of a signal output from an output terminal of the third longitudinally coupled resonator type acoustic wave filter relative to the input signal is substantially the same as the phase of the signal output from the second output terminal of the second longitudinally coupled resonator type acoustic wave filter relative to the input signal;
the output terminal of the first longitudinally coupled resonator type acoustic wave filter and the first output terminal of the second longitudinally coupled resonator type acoustic wave filter are connected to the first balanced signal terminal;
the output terminal of the third longitudinally coupled resonator type acoustic wave filter and the second output terminal of the second longitudinally coupled resonator type acoustic wave filter are connected to the second balanced signal terminal; and a number of pairs of electrode fingers of at least one of the IDTs of at least one of the first to third longitudinally coupled resonator type acoustic wave filters is different from a number of pairs of electrode fingers of the IDTs of the first to third longitudinally coupled resonator type acoustic wave filters other than the at least one of the first to third longitudinally coupled resonator type acoustic wave filters.

6. The acoustic wave filter device according to claim 5, wherein the piezoelectric substrate is a defined by a 40±5° Y-cut X-propagation $LiTaO_3$ substrate.

7. A duplexer comprising a transmission filter and a reception filter including the acoustic wave filter device according to claim 5.

* * * * *